(12) United States Patent
Sugiura et al.

(10) Patent No.: US 12,336,314 B2
(45) Date of Patent: Jun. 17, 2025

(54) PHOTODETECTOR COMPRISING AVALANCHE PHOTODIODES AND FIRST REGION SURROUNDING AVALANCHE PHOTODIODES

(71) Applicant: Panasonic Intellectual Property Management Co., Ltd., Osaka (JP)

(72) Inventors: Yuki Sugiura, Osaka (JP); Akito Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 553 days.

(21) Appl. No.: 17/733,610

(22) Filed: Apr. 29, 2022

(65) Prior Publication Data

US 2022/0271067 A1     Aug. 25, 2022

Related U.S. Application Data

(63) Continuation of application No. PCT/JP2020/040467, filed on Oct. 28, 2020.

(30) Foreign Application Priority Data

Oct. 30, 2019    (JP) ................................ 2019-197700

(51) Int. Cl.
     *H10F 39/00*      (2025.01)
     *H10F 39/18*      (2025.01)

(52) U.S. Cl.
     CPC ......... *H10F 39/8033* (2025.01); *H10F 39/18* (2025.01)

(58) Field of Classification Search
None
See application file for complete search history.

(56) References Cited

U.S. PATENT DOCUMENTS

| | | | |
|---|---|---|---|
| 9,178,100 B2 | 11/2015 | Webster et al. | |
| 2013/0193546 A1* | 8/2013 | Webster | H10F 71/00 257/438 |
| 2018/0197905 A1 | 7/2018 | Sakata et al. | |
| 2019/0288149 A1 | 9/2019 | Kokubun | |
| 2020/0106982 A1 | 4/2020 | Kasuga et al. | |

(Continued)

FOREIGN PATENT DOCUMENTS

| | | |
|---|---|---|
| JP | 2019-161047 A | 9/2019 |
| JP | 2020-150128 A | 9/2020 |

(Continued)

OTHER PUBLICATIONS

International Search Report issued in corresponding International Application No. PCT/JP2020/040467, dated Jan. 19, 2021 w/English Translation.

*Primary Examiner* — Daniel Whalen
(74) *Attorney, Agent, or Firm* — Rimon P.C.

(57) ABSTRACT

A solid-state image sensor includes at least two or more APDs formed on a substrate. First regions are arranged outside the APDs as viewed in plane. Adjacent ones of the APDs and the first regions are separated from each other through a separation region. A first voltage V21 is applied to a fourth semiconductor layer of the APD, and a second voltage V22 is applied to a fifth semiconductor layer of the first region. The first voltage V21 is higher than the second voltage V22.

16 Claims, 22 Drawing Sheets

(56) References Cited

U.S. PATENT DOCUMENTS

| | | |
|---|---|---|
| 2020/0292670 A1 | 9/2020 | Kubuta et al. |
| 2021/0005646 A1* | 1/2021 | Sugiura ................ H10F 39/802 |
| 2021/0028202 A1 | 1/2021 | Inoue et al. |

FOREIGN PATENT DOCUMENTS

| | | | |
|---|---|---|---|
| WO | 2017/043068 A1 | 3/2017 | |
| WO | 2018/216400 A1 | 11/2018 | |
| WO | 2019/189700 A1 | 10/2019 | |
| WO | WO-2019188244 A1 * | 10/2019 | ....... H01L 27/14603 |

* cited by examiner

PHOTODETECTOR COMPRISING AVALANCHE PHOTODIODES AND FIRST REGION SURROUNDING AVALANCHE PHOTODIODES

CROSS-REFERENCE TO RELATED APPLICATIONS

This application is a continuation under 35 U.S.C. § 111(a) of International Application No. PCT/JP2020/040467 filed on Oct. 28, 2020, which claims priority to Japanese Patent Application No. 2019-197700 filed on Oct. 30, 2019. The entire disclosures of these applications are incorporated by reference herein.

BACKGROUND

The present disclosure relates to a photodetector, and particularly relates to a photodetector of, e.g., a solid-state image sensor capable of detecting faint light.

In recent years, high-sensitive photodetectors have been utilized in various fields such as medical treatment, communication, biotechnology, chemistry, monitoring, vehicle installation, and radiation detection. For example, a configuration in which an avalanche photodiode (hereinafter referred to as an APD) is used for enhancing the sensitivity of a solid-state image sensor such as a complementary metal oxide semiconductor (CMOS) image sensor has been proposed (see, e.g., U.S. Pat. No. 9,178,100).

The APD is a photodiode whose photodetection sensitivity is enhanced in such a manner that a signal charge generated by photoelectric conversion is multiplied using avalanche breakdown.

A solid-state image sensor configured such that APDs are arranged in an array so that an image can be generated from faint incident light with a high resolution has been proposed (see, e.g., International Patent Publication No. 2017/043068).

SUMMARY

In the structure disclosed in International Patent Publication No. 2017/043068, the APD is formed below a pixel circuit, and the APDs are connected to each other through the same N-type semiconductor layer. For this reason, due to an influence of adjacent pixels, a current and a charge at a pixel array terminal end influence the inside of the pixel array. Particularly, an electric field unintentionally becomes high at an end portion of the APD pixel array in some cases. That is, the electric field needs to be relaxed at the end portion of the APD pixel array to improve a withstand voltage and reduce a leakage current.

For this reason, the present disclosure provides a photodetector capable of relaxing electric field concentration at an end portion of a pixel array portion and performing stable operation.

A photodetector according to one aspect of the present disclosure is a photodetector including at least two or more avalanche photodiodes (APDs) formed on a semiconductor substrate. A first region is arranged outside the APDs as viewed in plane. Adjacent ones of the APDs and the first region are separated from each other through a separation region. Each APD includes a first semiconductor layer of a second conductive type included in the semiconductor substrate and a fourth semiconductor layer of a first conductive type contacting the first semiconductor layer. The first region includes the first semiconductor layer and a fifth semiconductor layer of the first conductive type contacting the first semiconductor layer. A first voltage is applied to the fourth semiconductor layer of each APD, and a second voltage is applied to the fifth semiconductor layer of the first region. The first voltage is higher than the second voltage.

According to the present disclosure, the photodetector capable of relaxing electric field concentration at the end portion of the pixel array portion and performing stable operation can be provided.

DETAILED DESCRIPTION

Hereinafter, embodiments of the present disclosure will be described in detail based on the drawings. Description of the preferred embodiments below is merely an example in nature, and is not intended to limit the present disclosure and the application or use thereof.

First Embodiment

[Configurations of Solid-State Image Sensor and Pixel Array Portion]

Figure 1:
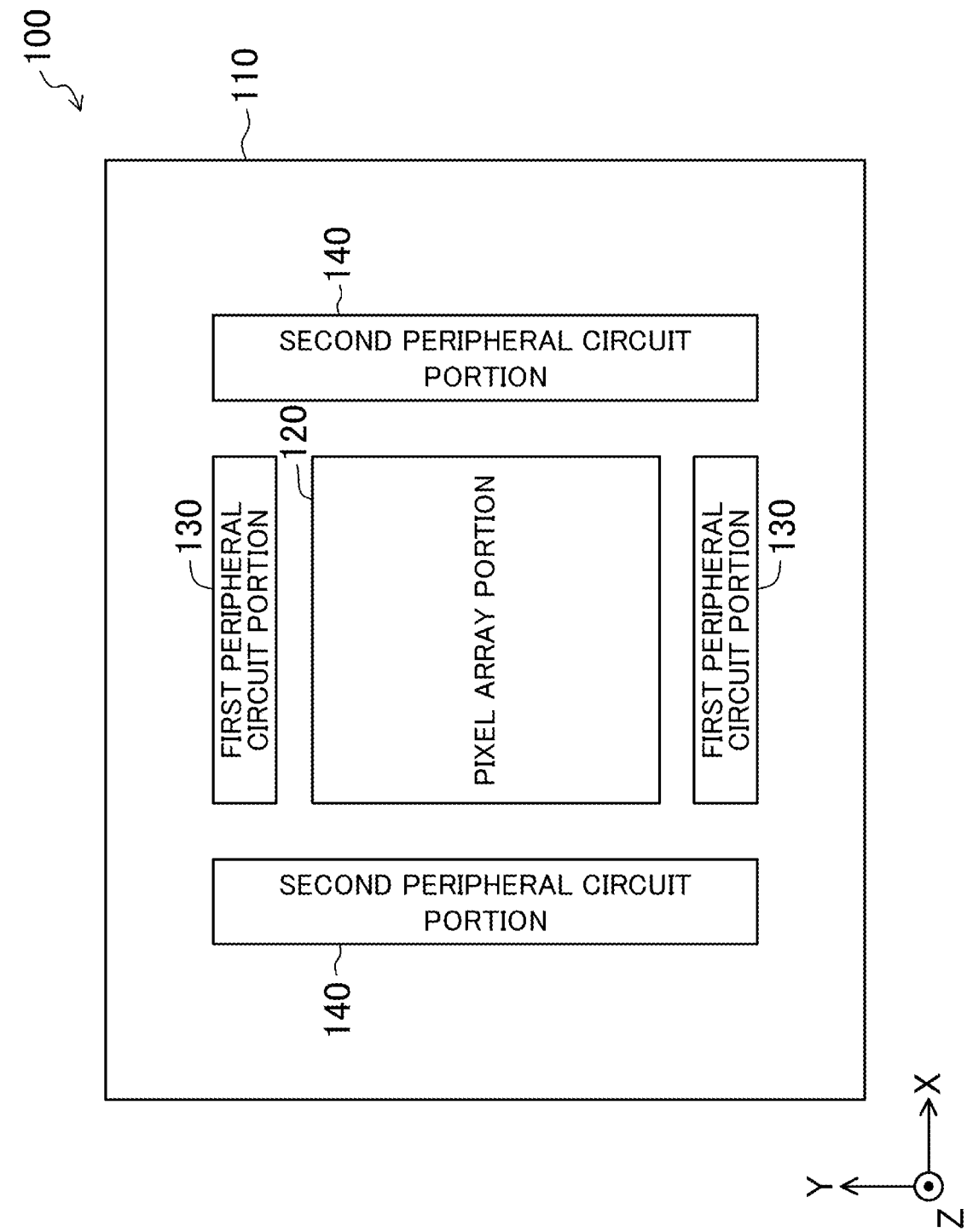
FIG. 1 shows a plan view of a solid-state image sensor according to a first embodiment.
Figure 2:
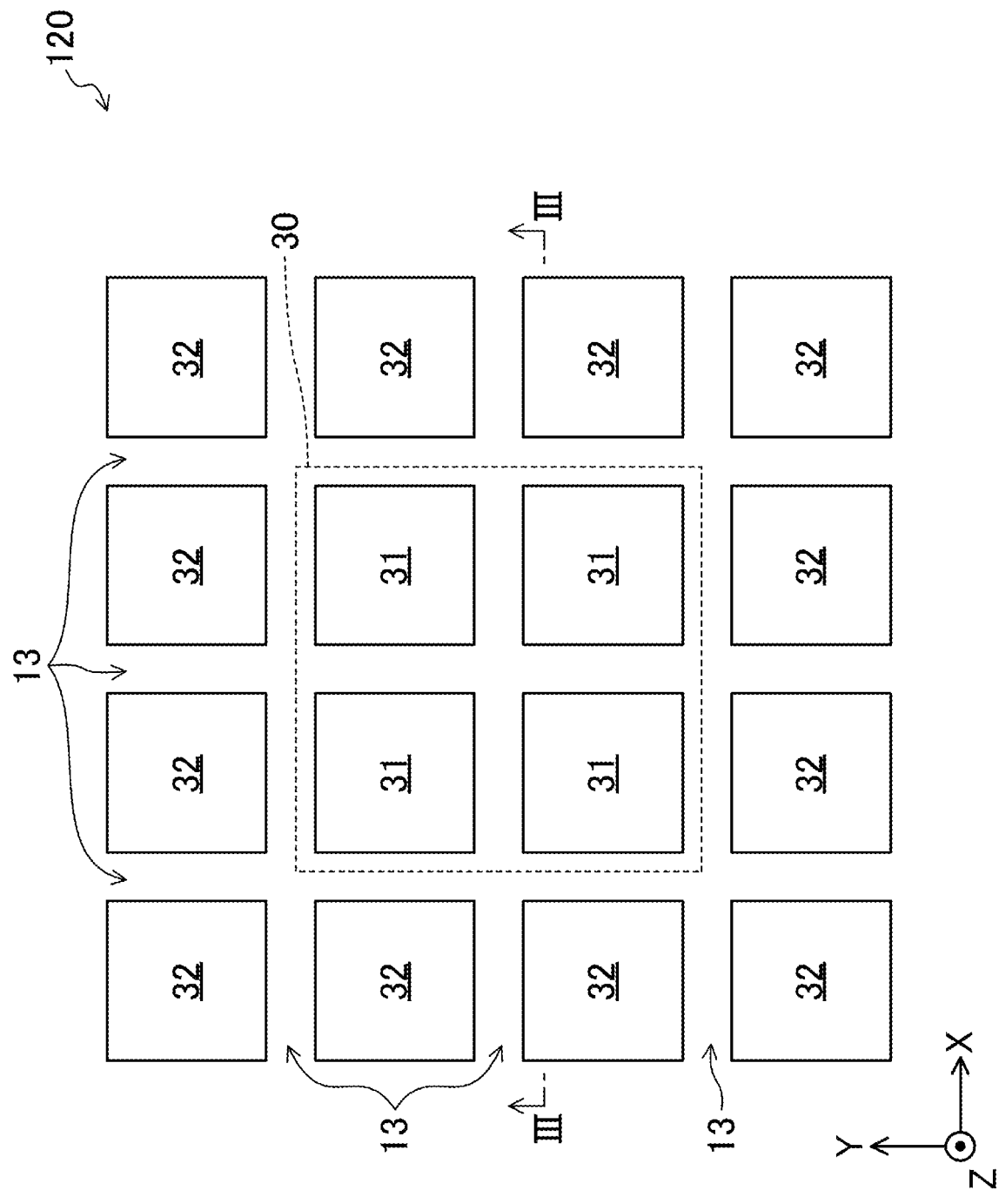
FIG. 2 shows a plan view of a pixel array portion.
Figure 3:
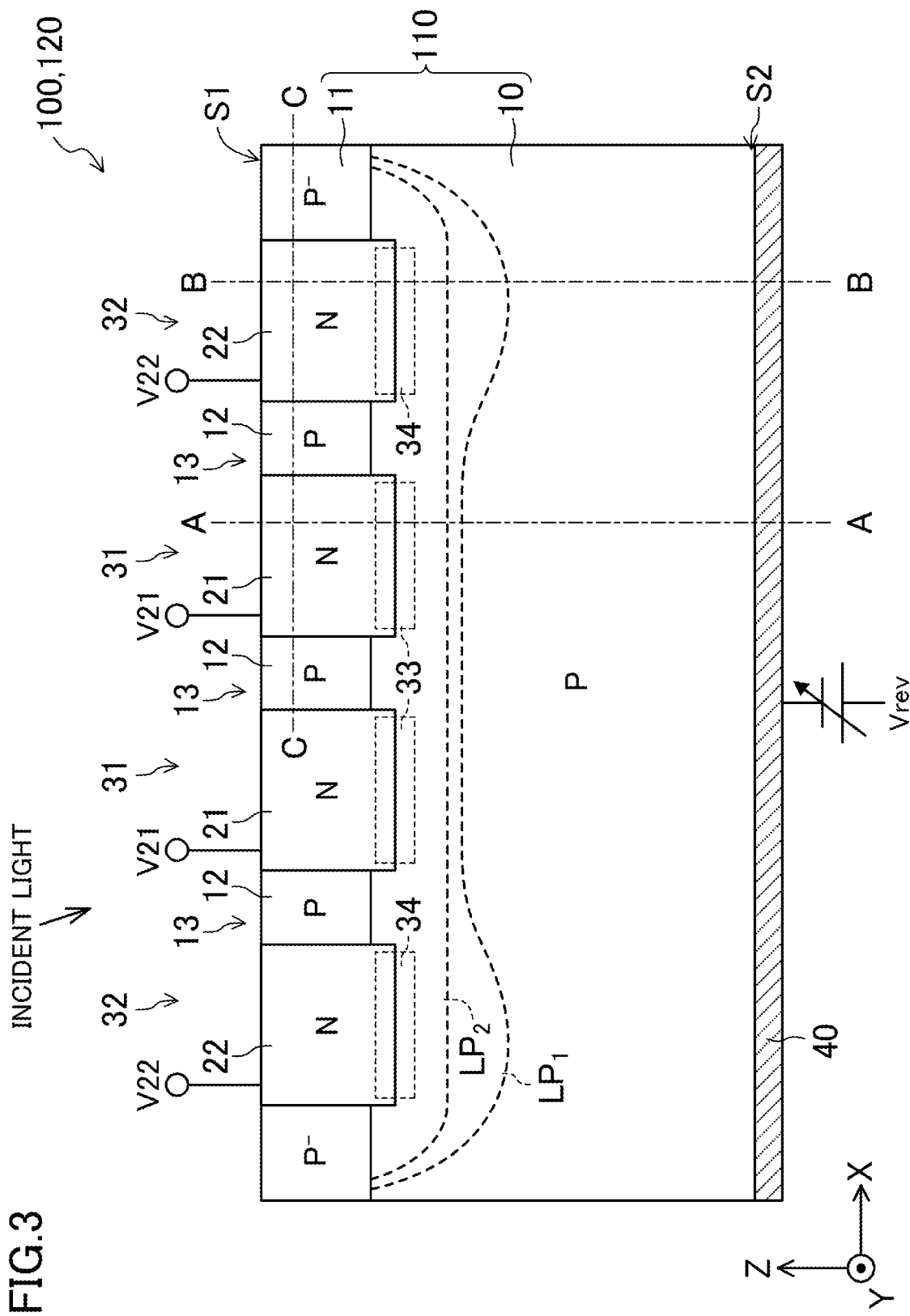
FIG. 3 shows a schematic sectional view along an III-III line of FIG. 2.

FIG. 1 shows a plan view of a solid-state image sensor according to the present embodiment, FIG. 2 shows a plan view of a pixel array portion, and FIG. 3 shows a schematic sectional view along an line III-III of FIG. 2. Note that for the sake of convenience in description, FIGS. 1 to 3 shows no contacts, interlayer insulating layers, and wirings in the solid-state image sensor 100 and these contacts, interlayer insulating layers, and wirings will not be described with reference to FIGS. 1 to 3. Moreover, in FIG. 2, the number of APDs 31 included in the pixel array portion 120 is different from an actual number. It may only be required that there are at least two or more APDs 31.

Note that in description below, a thickness direction of a semiconductor substrate 110 (hereinafter merely referred to as a substrate 110) will be sometimes referred to as a Z-direction and two directions perpendicular to each other in a plane perpendicular to the Z-direction will be sometimes referred to as an X-direction and a Y-direction. Moreover, "as viewed in plane" means viewing in the Z-direction. In the Z-direction, a side close to a second principal surface S2 on which a back electrode 40 (see FIG. 3) is arranged will be sometimes referred to as a lower side or below, and a side close to a first principal surface S1 opposite to the second principal surface S2 will be sometimes referred to as an upper side or above.

As shown in FIG. 1, the solid-state image sensor 100 includes the pixel array portion 120, first peripheral circuit portions 130, and second peripheral circuit portions 140, and these portions are formed on the first principal surface S1 of the substrate 110 (see FIG. 3). Note that the solid-state image sensor 100 is one example of a photodetector.

Figure 12:
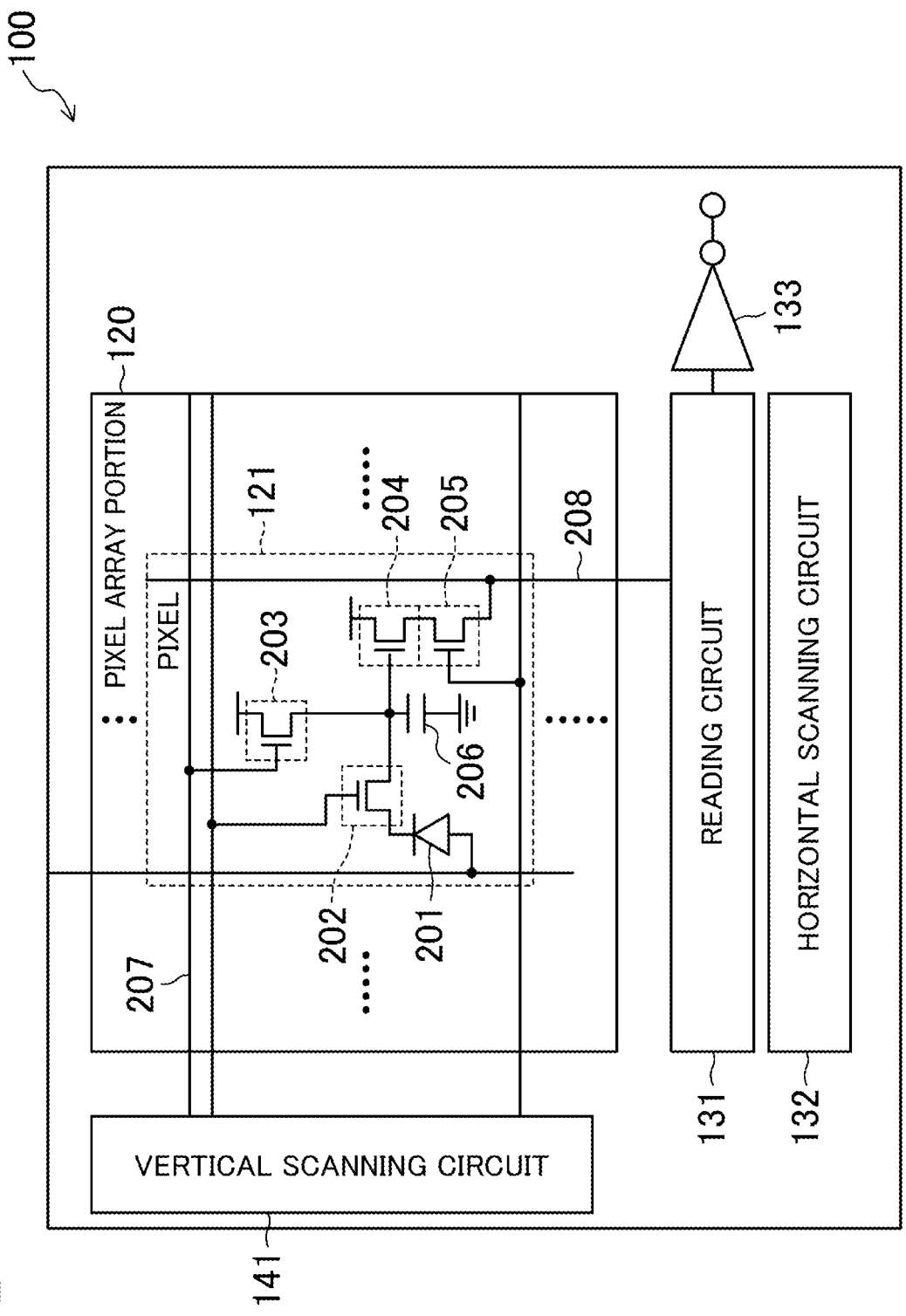
FIG. 12 shows a diagram of a circuit configuration of a solid-state image sensor according to the second embodiment.

The first peripheral circuit portion 130 includes, for example, a reading circuit 131 (see FIG. 12) for reading a signal from each pixel (see FIG. 12) of the pixel array portion 120, a horizontal scanning circuit 132 (see FIG. 12), and a buffer amplifier 133 (see FIG. 12). The second peripheral circuit portion 140 includes, for example, a vertical scanning circuit 141 (see FIG. 12).

As shown in FIG. 2, the pixel array portion 120 includes an APD array 30 and first regions 32 arranged outside the APD array 30. The APD array 30 includes the plurality of APDs 31 arranged in an array. The plurality of APDs 31 is arranged in a matrix along the X-direction and the Y-direction.

Specifically, as shown in FIG. 2, the first regions 32 are arranged to surround the outside of the APD array 30. In a case where the pixel array portion 120 includes a plurality of APD arrays 30, first regions 32 are also arranged outside each APD array 30. A separation region 13 is formed between adjacent ones of the APDs 31 and the first regions 32. As described later, the APD 31 forms a photodetection unit 201 (see FIG. 12) for a pixel. On the other hand, the first region 32 is provided for operating the APD 31 with a higher photon detection efficiency, but the first region 32 itself does not need to contribute to photodetection.

Figure 24:
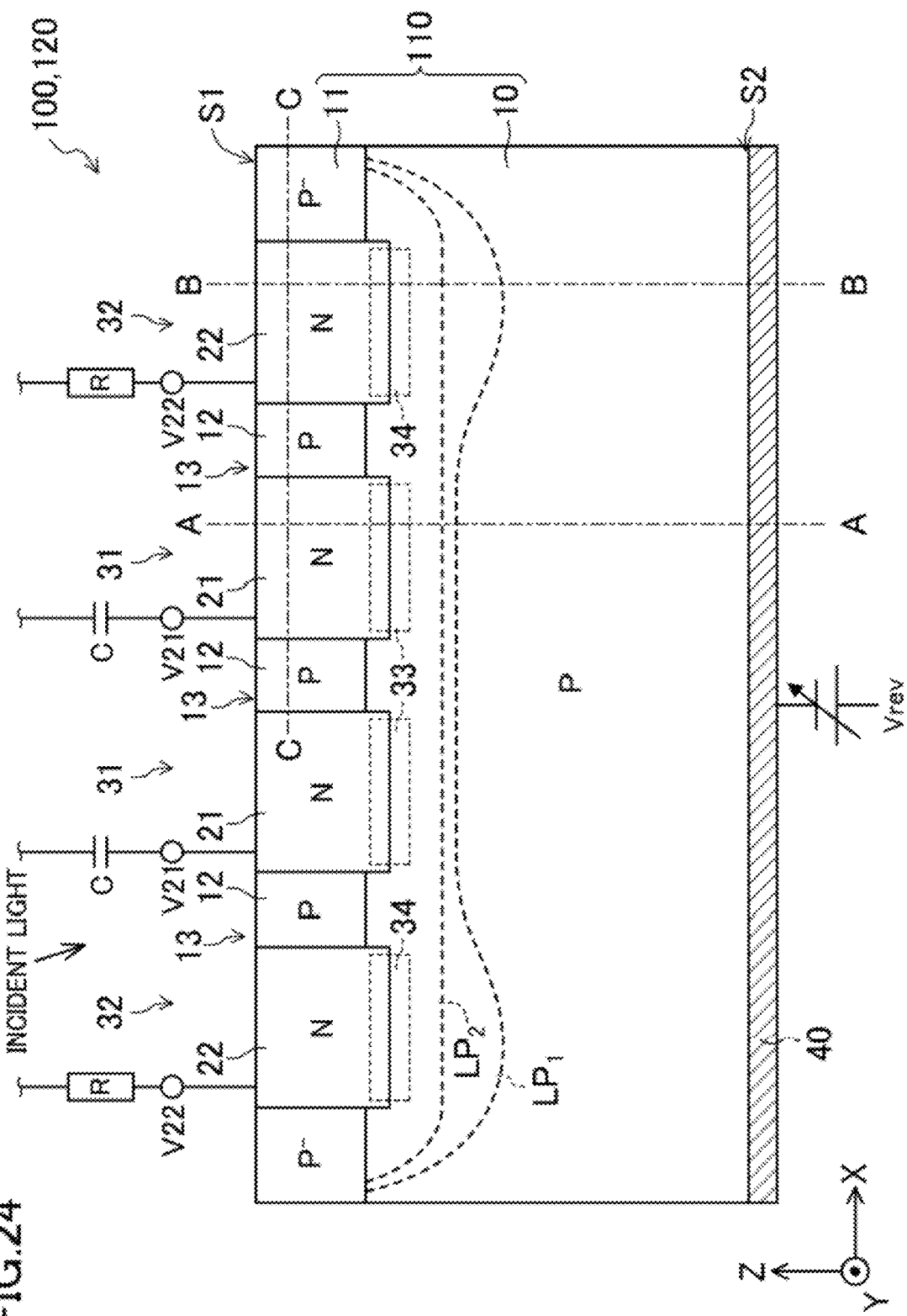
FIG. 24 shows a schematic sectional view of a pixel array portion to which quenching elements have been added.

In the specification of the present application, avalanche multiplication includes both of linear multiplication and Geiger multiplication. Particularly, in the case of a Geiger multiplication mode, one or more quenching elements (see FIG. 24) for stopping the Geiger multiplication may be provided. A resistor R, a capacitor C, or a transistor may be, for example, used as such a quenching element in this case, but the type of element is not limited. Note that a linear multiplication mode in the specification of the present application indicates an "APD operation mode in which a reverse bias applied to an APD is equal to or lower than an avalanche breakdown voltage and charge multiplication occurs due to collision ionization." Moreover, the Geiger multiplication mode indicates an "APD operation mode in which an APD is at least temporarily operated by application of a reverse bias of equal to or higher than an avalanche breakdown voltage to the APD."

Particularly, the configuration according to the present disclosure may be utilized for an element such as a multi-pixel photon counter (MPPC) or a single photon avalanche diode (SPAD).

Preferably, in the present embodiment, the APD 31 is operated in the Geiger multiplication mode and the first region 32 is operated in the linear multiplication mode, but the operation mode is not limited to above. That is, the APD 31 may be operated in the linear multiplication mode, or the first region 32 may be operated in the Geiger multiplication mode.

Particularly, in the case of operating the first region 32 in the Geiger multiplication mode, a resistor R (see FIG. 24) is preferably connected to the first region 32 in series to limit the amount of current flowing in the first region 32. An example of a resistance value at this point is equal to or higher than 100Ω. Note that the first region 32 is not necessarily quenched and steady current may flow in the first region 32.

Different types of elements may be used as a quenching element for the APD 31 and a quenching element for the first region 32, and examples thereof may include a configuration in which the APD 31 is connected to a transistor and the first region 32 is connected to a resistor.

As shown in FIG. 3, the substrate 110 includes a first semiconductor layer 10 and a second semiconductor layer 11. The first semiconductor layer 10 may be a p-type single-crystal silicon substrate at least partially formed by an epitaxial growth method, and the second semiconductor layer 11 is a p-type epitaxial layer formed on an upper surface of the first semiconductor layer 10. The p-type impurity concentration of the second semiconductor layer 11 is set lower than the p-type impurity concentration of the first semiconductor layer 10.

Note that as the conductive type of each semiconductor layer in the specification of the present application, an n-type will be sometimes referred to as a "first conductive type" and a p-type will be sometimes referred to as a "second conductive type." Note that in an opposite case, the n-type will be sometimes referred to as a "second conductive type," for example. Moreover, in the specification of the present application, the impurity concentration indicates an effective impurity concentration, and indicates a difference in a concentration in a case where different conductive types of impurities are present in the same region.

The APD 31 mainly includes the first semiconductor layer 10 and a fourth semiconductor layer 21. The fourth semiconductor layer 21 is an n-type semiconductor layer, and is formed in such a manner that an n-type impurity is, by, e.g., ion implantation, injected into the substrate 110 through the first principal surface S1 by means of a not-shown resist mask pattern. An avalanche multiplication region 33 is formed at a junction interface between the first semiconductor layer 10 and the fourth semiconductor layer 21 and the vicinity thereof.

Note that FIG. 3 shows that the first semiconductor layer 10 is a semiconductor substrate or an integrated structure of a semiconductor substrate and a p-type epitaxial layer. However, the solid-state image sensor 100 of the present embodiment is not limited to formation of an avalanche multiplication region between semiconductor substrates, and as described later with reference to FIG. 23, both of an n-type region and a p-type region forming an avalanche multiplication region may be formed by implantation. Moreover, the solid-state image sensor 100 of the present embodiment is not limited to a PN junction structure in the APD 31, and the present invention may be utilized for a general structure such as a reach-through type or PIN type structure. Particularly, the first semiconductor layer 10 of FIG. 3 is shown as a single region, but may show a spatial concentration change. For example, in the case of the PIN type, the P-type concentration on the second principal surface S2 side may be higher while the concentration on the first principal surface S1 side is lower, and an end portion of the avalanche multiplication region 33 of the APD 31 on the second principal surface S2 side may extend to the vicinity of the first principal surface S1.

For the example of FIG. 3, it is assumed that the p-type impurity concentration of the first semiconductor layer 10 is uniform or gradually increases from the first principal surface S1 side to the second principal surface S2 side and the width of the avalanche multiplication region 33 of the APD 31 in the substrate thickness direction is a relatively-short width of equal to or less than 2 μm. With this configuration, a breakdown voltage can be decreased. The breakdown voltage is typically equal to or lower than an absolute value of 50 V. Moreover, the width of the separation region 13 can be narrowed to about the width of the avalanche multiplication region 33, and therefore, the effect of narrowing a separation width and achieving miniaturization can be provided.

The first region 32 mainly includes the first semiconductor layer 10 and a fifth semiconductor layer 22. The fifth semiconductor layer 22 is an n-type semiconductor layer, and is formed in a method similar to that for forming the fourth semiconductor layer 21. Moreover, an avalanche multiplication region 34 is formed at a junction interface between the first semiconductor layer 10 and the fifth semiconductor layer 22 and the vicinity thereof. In the present embodiment, an example where the fourth semiconductor layer 21 and the fifth semiconductor layer 22 are simultaneously formed during the step of manufacturing the solid-state image sensor 100 is described. Thus, the n-type impurity concentration of the fourth semiconductor layer 21 and the n-type impurity concentration of the fifth semiconductor layer 22 may be equal to each other, but these layers are not necessarily formed in the same step and may have different concentrations.

Note that in the specification of the present application, "same" or "equal" means that comparative targets are, including a variation etc. in the manufacturing step, same as or equal to each other and does not mean that the comparative targets are precisely same as or equal to each other.

The separation region 13 includes a third semiconductor layer 12. The third semiconductor layer 12 is a p-type semiconductor layer, and is formed in such a manner that a p-type impurity is, by, e.g., ion implantation, injected into the substrate 110 through the first principal surface S1 by means of a not-shown resist mask pattern.

In the present embodiment, the p-type impurity concentration of the first semiconductor layer 10 is about $1 \times 10^{16}$ cm$^{-3}$ to $1 \times 10^{18}$ cm$^{-3}$, the p-type impurity concentration of the second semiconductor layer 11 is about $1 \times 10^{14}$ cm$^{-3}$ to $1 \times 10^{17}$ cm$^{-3}$, and the p-type impurity concentration of the third semiconductor layer 12 is about $1 \times 10^{15}$ cm$^{-3}$ to $1 \times 10^{18}$ cm$^{-3}$.

The p-type impurity concentration of the second semiconductor layer 11 is set lower than the p-type impurity concentration of the first semiconductor layer 10.

Each of the p-type impurity concentrations of the fourth semiconductor layer 21 and the fifth semiconductor layer 22 is about $5 \times 10^{16}$ cm$^{-3}$ to $1 \times 10^{19}$ cm$^{-3}$. Note that the impurity concentrations of the first to fifth semiconductor layers 10 to 12, 21, 22 may be changed as necessary according to, e.g., the specifications of the solid-state image sensor 100 and performance required for the APD 31 and the first region 32.

The back electrode 40 is formed on the second principal surface S2 of the substrate 110, and a predetermined voltage, a predetermined voltage Vrev in the present embodiment, is applied to the back electrode 40. The second principal surface S2 faces the first principal surface S1 in the Z-direction. Note that the voltage Vrev is a negative voltage. The value of the voltage Vrev may be variably adjusted or a fixed value. For the back electrode 40, metal allowing ohmic contact with the first semiconductor layer 10 is preferably used.

The separation region 13 is depleted. Specifically, the separation regions 13 is depleted to a region apart from the junction interface between the separation regions 13 and the fourth semiconductor layer 21 or the fifth semiconductor layer 22 by a predetermined distance. Note that this distance depends on the p-type impurity concentration of the separation regions 13 and the n-type impurity concentration of the fourth semiconductor layer 21 or the fifth semiconductor layer 22 and changes according to these impurity concentrations.

Since the separation region 13 is depleted and a later-described separation barrier (see FIG. 5) is formed, adjacent ones of the APDs 31 are electrically separated from each other. In other words, the signals of the APDs 31 can be separately output without being mixed with each other. Particularly, since the separation region 13 is depleted, an electric field in a lateral direction between the APD 31 and the separation region 13 can be relaxed, the separation region 13 can be narrowed, and the pixel can be miniaturized. Moreover, it is not necessary to apply fixed voltage to the separation region 13 from the first principal surface S1 side or separately form an insulating separation region such as a shallow trench isolation (STI) to electrically separate the APDs 31 from each other. Thus, it is not necessary to arrange a contact to be electrically connected to the separation region 13 or form a trench extending from the surface of the separation region 13, i.e., the first principal surface S1, into the substrate 110 in the separation region 13.

Note that the entirety of the separation region 13 is not necessarily depleted and, e.g., the center of an intersection (see FIG. 2) between the separation region 13 extending in the X-direction and the separation region 13 extending in the Y-direction is not necessarily depleted.

The reverse bias is applied to each of the APDs 31 and the first regions 32 through not-shown wirings and contacts. Specifically, a voltage V21 (a first voltage V21) is applied to the fourth semiconductor layer 21 in the APD 31, and a voltage V22 (a second voltage V22) is applied to the fifth semiconductor layer 22 in the first region 32. The wiring for applying the voltage V21 is different from the wiring for applying the voltage V22, and these wirings are electrically separated from each other.

Figure 4:
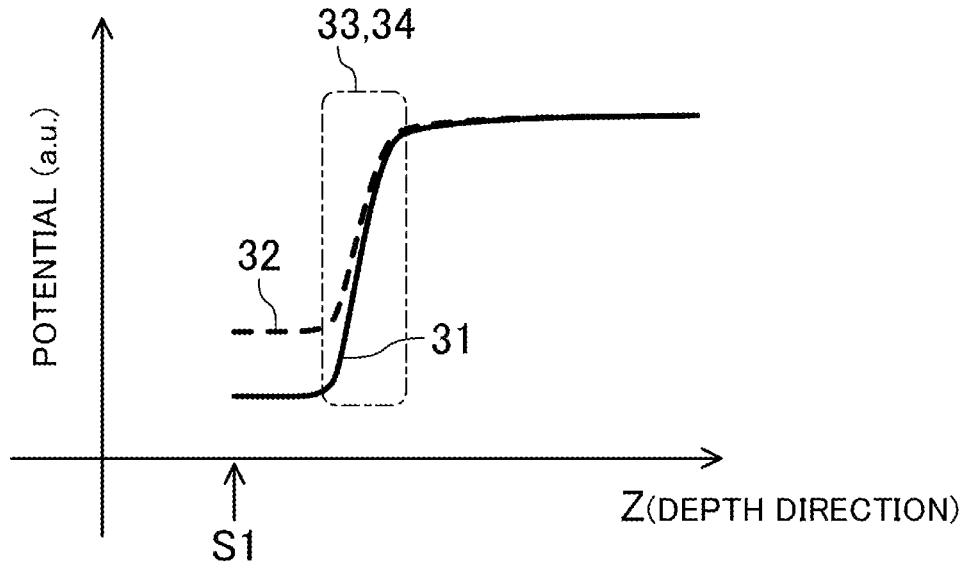
FIG. 4 shows potential profiles along an A-A line and a B-B line of FIG. 3.
Figure 5:
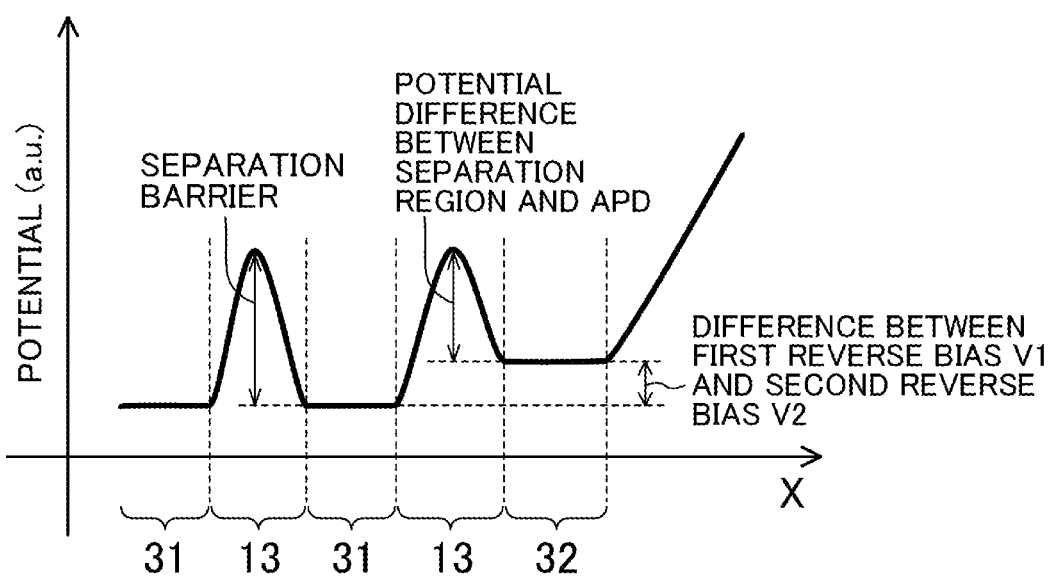
FIG. 5 shows a potential profile along a C-C line of FIG. 3.

FIG. 4 shows potential profiles along an A-A line and a B-B line of FIG. 3, and FIG. 5 shows a potential profile along a C-C line of FIG. 3. Note that FIG. 4 collectively shows the potential profile along the A-A line and the potential profile along the B-B line. The potential profiles shown in FIG. 4 are profiles in the Z-direction, i.e., a depth direction from the first principal surface S1 of the substrate 110, and the potential profile shown in FIG. 5 is a profile in the X-direction, i.e., a direction parallel with the first principal surface S1 of the substrate 110.

Numbers in the potential profiles shown in FIGS. 4 and 5 and figures shown thereafter correspond to the APD 31, the first region 32, the avalanche multiplication regions 33, 34, and the separation region 13 shown in FIGS. 2 and 3.

As shown in FIG. 4, the APD 31 and the first region 32 are different from each other in a potential profile in the Z-direction, and specifically, the gradient of the potential over a PN junction boundary is greater in the APD 31 than in the first region 32. This is because a first reverse bias V1 applied to the PN junction in the APD 31 is set higher than a second reverse bias V2 applied to the PN junction in the first region 32. The first and second reverse biases V1, V2 are represented by Expressions (1) and (2) below.

$$|V1|=V21+|Vrev| \quad (1)$$

$$|V2|=V22+|Vrev| \quad (2)$$

Note that the first and second reverse biases V1, V2 are zero or a positive voltage.

Since the gradient of the potential is equivalent to an electric field intensity, it can be said that an electric field applied to the avalanche multiplication region 33 of the APD 31 is higher than an electric field applied to the avalanche multiplication region 34 of the first region 32.

Since the n-type impurity concentrations of the fourth semiconductor layer 21 and the fifth semiconductor layer 22 are equal to each other, a p-type depletion layer end extending to the first semiconductor layer 10 and the second semiconductor layer 11 is, as indicated by a dashed line $LP_2$ in FIG. 3, positioned at the same distance from the PN junction boundary in the APDs 31 and the first regions 32 if the first and second reverse biases V1, V2 are equal to each other. On the other hand, if the first reverse bias V1 is higher than the second reverse bias V2, the p-type depletion layer end is, as indicated by a dashed line $LP_1$, positioned farther from the PN junction boundary around the first region 32 than around the APD 31. That is, the depletion layer extending to the first semiconductor layer 10 around the first region 32 is wider than the depletion layer extending around the APD 31.

As shown in FIG. 5, the separation barrier is equivalent to a difference between the potential of the separation region 13 and the potential of the APD 31. Since the separation barrier is formed in the separation region 13, such a separation barrier prevents a signal charge accumulated in the fourth semiconductor layer 21 of the APD 31 from flowing into an adjacent APD 31 or first region 32 through the separation region 13. With this configuration, e.g., color mixing among the pixels is prevented.

The separation barrier is determined according to the impurity profile of the separation region 13, the impurity profiles of the fourth semiconductor layer 21 and the fifth semiconductor layer 22 arranged around the separation region 13, the conditions for voltage to be applied to the pixel array portion 120. For example, the separation barrier also changes according to the voltage Vrev to be applied to the back electrode 40 and the values of the first and second reverse biases V1, V2. Note that the separation region 13 surrounding one APD 31 preferably has constant width and p-type impurity concentration.

Since the width and p-type impurity concentration of the separation region 13 are determined according to limitations on the height of the separation barrier and an electric field in the separation region 13, the electric characteristics of the APD 31 are easily maintained if the width and p-type impurity concentration of the separation region 13 surrounding one APD 31 are constant among the separation regions 13. The first region 32 fulfills a role in equally maintaining separation characteristics between the APD 31 adjacent to the first region 32 and the APD 31 adjacent only to the APD 31.

As shown in FIG. 5, a difference between the first reverse bias V1 and the second reverse bias V2 is set smaller than a difference between the potential of the separation region 13 and the potential of the first region 32.

[Photodetection Operation of Solid-State Image Sensor]

Light having entered through the first principal surface S1 is absorbed by the first semiconductor layer 10 of the APD 31 and is photoelectrically converted, and accordingly, an electron-hole pair as a carrier is generated. Of the generated carrier, the electron drifts to the first principal surface S1 side along a potential gradient, and reaches the avalanche multiplication region 33. On the other hand, the hole of the generated carrier is discharged to the back electrode 40 without being multiplied.

At this point, if the absolute value of the voltage Vrev to be applied to the back electrode 40 is set greater than the absolute value of the breakdown voltage of the APD 31, the electron having flowed into the avalanche multiplication region 33 is avalanche-multiplied due to collision ionization. Accordingly, many signal electrons can be generated, and even faint light which cannot be normally detected because such light is buried in noise can be detected. That is, the photon detection efficiency of the solid-state image sensor 100 can be significantly enhanced.

The voltage Vrev is preferably set to such an extent that the first region 32 is not broken down, and no photodetection is performed by the first region 32.

Note that in the specification of the present application, the breakdown voltage indicates such a voltage that a carrier multiplication factor in the avalanche multiplication region rapidly increases when the voltage to be applied to the APD 31 is changed.

Advantageous Effects Etc

As described above, the solid-state image sensor (photodetector) 100 according to the present embodiment is configured such that at least two or more APDs 31 are formed on the substrate 110 and adjacent ones of the APDs 31 are separated by the separation region 13.

The first regions 32 are arranged outside the APD array 30 including the plurality of APDs 31.

The APD 31 includes the p-type first semiconductor layer 10 included in the substrate 110 and the n-type fourth semiconductor layer 21 contacting the first semiconductor layer 10. The avalanche multiplication region 33 is formed in the vicinity of the interface between the first semiconductor layer 10 and the fourth semiconductor layer 21.

The first region 32 includes the first semiconductor layer 10 and the n-type fifth semiconductor layer 22 contacting the first semiconductor layer 10. The avalanche multiplication region 34 is formed in the vicinity of the interface between the first semiconductor layer 10 and the fifth semiconductor layer 22.

In the solid-state image sensor 100, the electric field to be applied to the avalanche multiplication region 33 of the APD 31, i.e., the PN junction in the APD 31, is higher than the electric field to be applied to the avalanche multiplication region 34 of the first region 32, i.e., the PN junction in the first region 32.

The separation region 13 is provided between adjacent ones of the APDs 31 so that the APDs 31 can be independently operated. Moreover, e.g., color mixing among the pixels is prevented.

The electric field to be applied to the PN junction in the APD 31 is set higher than the electric field to be applied to the PN junction in the first region 32 so that electric field concentration can be relaxed at a peripheral portion (hereinafter referred to as an end portion of the pixel array portion 120) of the pixel array portion 120 and stable photodetection operation, i.e., stable operation of the APD 31, can be achieved. This will be further described.

First, a case where the pixel array portion 120 includes the plurality of APDs 31 and the separation regions 13 provided thereamong is assumed. In this case, an electric field is high at the end portion of the pixel array portion 120 in some cases.

The inventor(s) has found that in the structure in which the separation region 13 is depleted, one APD 31 influences the potential of an adjacent APD 31, an electric field in the lateral direction at an end portion of the APD 31 can be reduced, and electric field concentration can be reduced. However, no adjacent APD 31 is present at one end portion of a pixel positioned at the end portion of the pixel array portion 120, and for this reason, an electric field in the lateral direction at such an end portion of the APD 31 cannot be reduced and tendency shows that the electric field is higher than that inside the pixel array portion 120. In addition, a bottom portion of the n-type semiconductor layer of the APD 31 is in a corner shape at the end portion of the pixel array portion 120, and for this reason, tendency shows that the electric field is higher than that inside the pixel array portion 120 (see FIG. 3). These are problems which are not caused in a structure in which a separation region is not depleted as in U.S. Pat. No. 9,178,100.

Further, due to the step of forming the fourth semiconductor layer 21, the electric field becomes higher at the end portion of the pixel array portion 120 in some cases. As described above, the fourth semiconductor layer 21 is formed in such a manner that the n-type impurity is injected into the substrate 110 by, e.g., ion implantation. The resist mask pattern used for such formation is a pattern in which a plurality of opening patterns corresponding to the outer shapes of the APDs 31 is arranged in an array. It has been well known in the step of manufacturing a semiconductor device that in such an array pattern, the opening patterns at an outer peripheral portion more easily lose the shapes thereof as compared to the opening patterns formed inside. For example, in a case where the opening pattern at the outer peripheral portion is in a tapered shape, the n-type impurity spreads beyond or does not reach, upon formation, the mask opening pattern at a peripheral edge portion of the APD 31.

Due to such a situation, the depletion layer width is narrowed or an internal electric field at the PN junction is increased at the end portion of the pixel array portion 120. As a result, the electric field is increased at the end portion of the pixel array portion 120.

There is a probability that the high electric field at the end portion of the pixel array portion 120 results in an insufficient increase in the electric field to be applied to the avalanche multiplication region 33 in the pixel array portion 120, and accordingly, avalanche multiplication is less likely to occur and the photon detection efficiency of the APD 31 is degraded.

The following method for solving this problem is assumed: the impurity concentration of the fourth semiconductor layer 21 is decreased at the APD 31 positioned at the end portion of the pixel array portion 120, and in this manner, the electric field at such a portion is decreased, for example. However, in this case, there is a probability that the separation barrier cannot be ensured in the separation region around the APD 31 positioned at the end portion of the pixel array portion 120 due to the enlarged depletion layer.

On the other hand, according to the present embodiment, since the first regions 32 where the electric field to be applied to the PN junction is lower than that in the APD 31 are arranged outside the APDs 31, electric field concentration can be reduced at the end portion of the pixel array portion 120 without the need for narrowing the area of the avalanche multiplication region 33 of the APD 31. Accordingly, degradation of the photon detection efficiency of the APD 31 can be reduced, and stable operation of the APD 31 and therefore stable operation of the solid-state image sensor 100 can be achieved.

The separation region 13 is depleted at least to the region apart from the surface contacting the APD 31, i.e., the junction interface between the separation region 13 and the fourth semiconductor layer 21 or the fifth semiconductor layer 22, by the predetermined distance.

Since the separation region 13 is depleted as described above and the separation barrier is formed as described above, adjacent ones of the APDs 31 can be electrically separated from each other. Moreover, since the APDs 31 are electrically separated from each other through the depleted separation regions 13, a pixel array pitch can be decreased at the pixel array portion 120 and higher integration of the pixel array portion 120 can be achieved.

In the separation region 13, no contact connected to the separation region 13 is arranged, and no trench extending inwardly from the surface of the separation region 13 is formed.

Since the separation region 13 is depleted and the separation barrier is formed, it is not necessary to form such contact and trench. Moreover, since no contact and trench are provided, it is not necessary to expand the width of the separation region 13. With this configuration, the pixel array pitch can be decreased at the pixel array portion 120, and much higher integration of the pixel array portion 120 can be achieved.

The first reverse bias V1 to be applied to the APD 31 is higher than the second reverse bias V2 to be applied to the first region 32.

With this configuration, even if the impurity concentration profile of the APD 31 and the impurity concentration profile of the first region 32 are the same as each other, the electric field to be applied to the avalanche multiplication region 33 of the APD 31 can be set higher than the electric field to be applied to the avalanche multiplication region 34 of the first region 32 and the above-described advantageous effects can be provided. Moreover, the fourth semiconductor layer 21 of the APD 31 and the fifth semiconductor layer 22 of the first region 32 can be simultaneously formed, and an increase in the cost for manufacturing the solid-state image sensor 100 can be suppressed. Further, since the voltages to be applied to the APD 31 and the first region 32 from the back electrode 40 can be set equal to each other, the structure of the back electrode 40 can be simplified without the need for increasing the number of power sources for driving the solid-state image sensor 100. With this configuration, an increase in the cost for manufacturing the solid-state image sensor 100 can be also suppressed.

Note that as described later, in a case where a hole generated by photoelectric conversion is avalanche-multiplied into a signal charge, the polarities of the first and second reverse biases V1, V2 need to be reversed. Also considering this point, it can be said that the above-described advantageous effects can be provided in such a manner that the absolute value of the first reverse bias V1 to be applied to the APD 31 is set greater than the absolute value of the second reverse bias V2 to be applied to the first region 32.

The difference between the first reverse bias V1 and the second reverse bias V2 is set smaller than the difference in the potential between the separation region 13 and the first region 32.

As described above, the second reverse bias V2 to be applied to the first region 32 is set lower than the first reverse bias V1 to be applied to the APD 31 so that the electric field to be applied to the avalanche multiplication region 34 of the first region 32 can be decreased.

However, a relationship between the first and second reverse biases V1, V2 is limited by electric separation characteristics of the APDs 31. As clearly seen from FIG. 5, when the difference between the first reverse bias V1 and the second reverse bias V2 reaches the substantially same level as the separation barrier, electric separation of the APD 31 and the first region 32 becomes difficult. For this reason, the relationship between the first reverse bias V1 and the second reverse bias V2 is set as described above so that electric separation among the APDs 31 can be ensured while the electric field to be applied to the avalanche multiplication region 34 of the first region 32 is decreased.

Note that as described above, the first region 32 does not necessarily contribute to photodetection, and upon photodetection operation of the solid-state image sensor 100, the multiplication factor of the first region 32 may be lower than the multiplication factor of the APD 31 and avalanche breakdown does not necessarily particularly occur.

That is, it can be also said that the first region 32 has the PN junction structure of the p-type first semiconductor layer 10 and the n-type fifth semiconductor layer 22 contacting the first semiconductor layer 10.

Thus, it can be also said that the solid-state image sensor (photodetector) 100 according to the present embodiment includes the following configuration. The solid-state image sensor 100 is configured such that at least one or more APDs 31 and at least one or more PN junction structures 32 are formed on the substrate 110, adjacent ones of the APDs 31 are separated from each other through the separation regions 13, and adjacent ones of the APDs 31 and the PN junction structures 32 are separated from each other through the separation regions 13. As viewed in plane, the PN junction structures 32 are arranged outside the APDs 31.

The APD 31 includes the p-type first semiconductor layer 10 included in the substrate 110 and the n-type fourth semiconductor layer 21 contacting the first semiconductor layer 10. The avalanche multiplication region 33 is formed in the vicinity of the interface between the first semiconductor layer 10 and the fourth semiconductor layer 21.

The PN junction structure 32 includes the first semiconductor layer 10 and the n-type fifth semiconductor layer 22 contacting the first semiconductor layer 10. The PN junction region 34 is formed in the vicinity of the interface between the first semiconductor layer 10 and the fifth semiconductor layer 22.

In the solid-state image sensor 100, the electric field to be applied to the PN junction in the APD 31 is set higher than the electric field to be applied to the PN junction in the PN junction structure 32. In other words, the voltage V21 (the first voltage V21) is applied to the fourth semiconductor layer 21 of the APD 31, the voltage V22 (the second voltage V22) is applied to the fifth semiconductor layer 22 of the first region 32, and the voltage Vrev is applied to the first semiconductor layer 10. As clearly seen from Expression (1) and Expression (2), the voltage V21 is higher than the voltage V22.

Note that the technique of setting the electric field to be applied to the PN junction in the APD 31 higher than the electric field to be applied to the PN junction in the first region 32 or the electric field to be applied to the PN junction in the PN junction structure 32 is not limited to one described in the present embodiment, and other techniques may be employed as necessary. Specific techniques will be described in a first variation and a second variation described below.

<First Variation>

Figure 6:
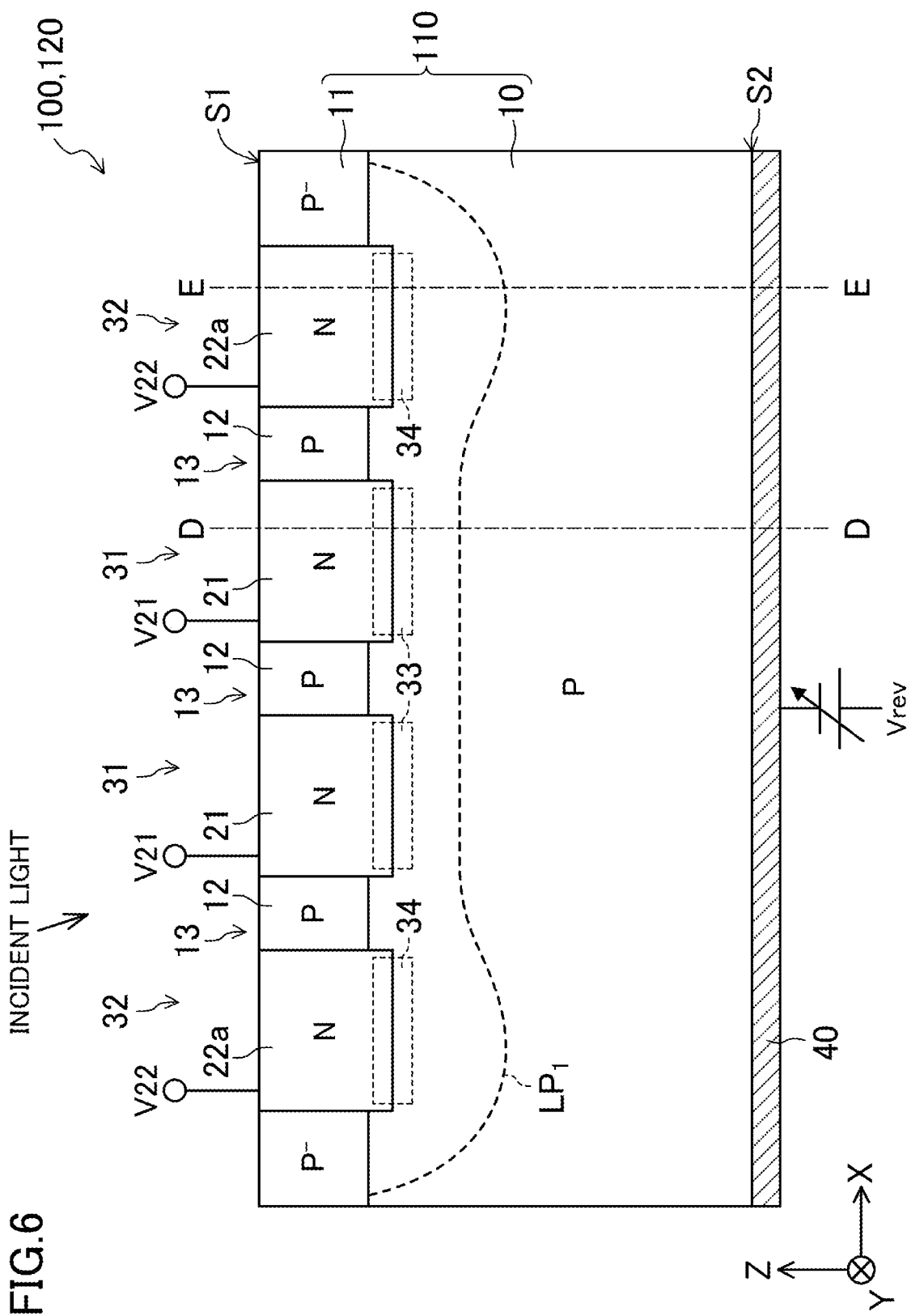
FIG. 6 shows a schematic sectional view of a pixel array portion according to a first variation.
Figure 7:
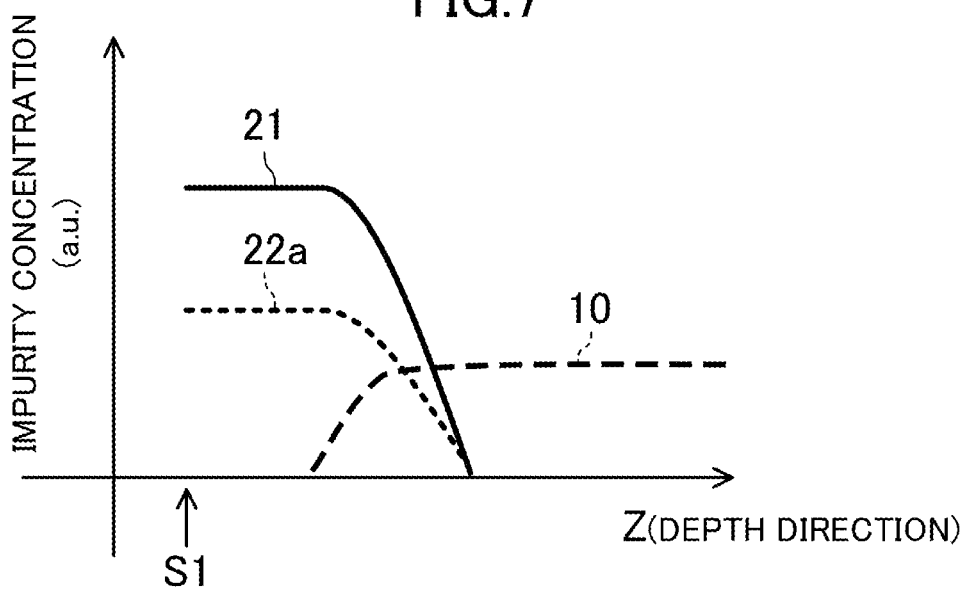
FIG. 7 shows impurity concentration profiles along a D-D line and an E-E line of FIG. 6.
Figure 8:
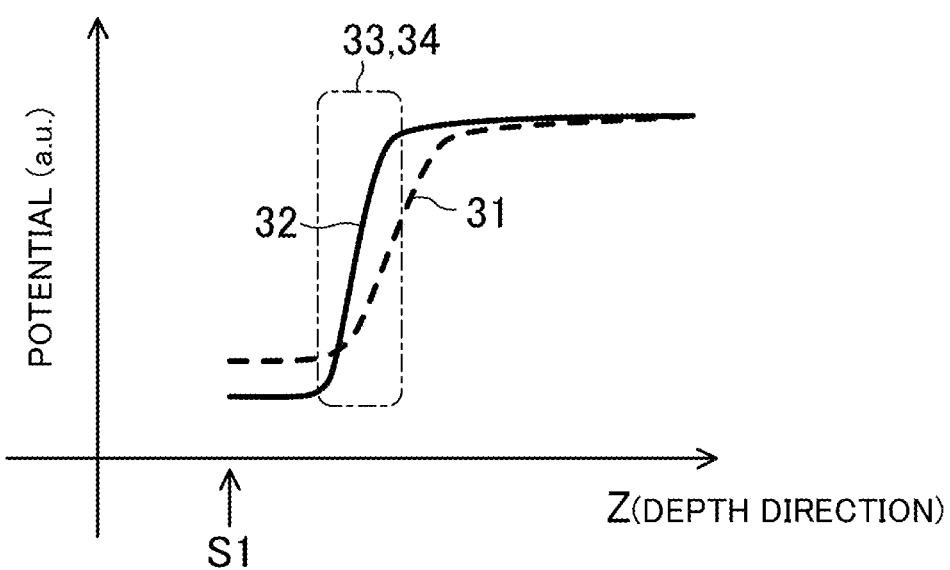
FIG. 8 shows potential profiles along the D-D line and the E-E line of FIG. 6.

FIG. 6 shows a schematic sectional view of a pixel array portion according to the present variation. FIG. 7 shows impurity concentration profiles along a D-D line and an E-E line of FIG. 6, and FIG. 8 shows potential profiles along the D-D line and the E-E line of FIG. 6. Note that FIG. 6 is a view corresponding to FIG. 3.

Note that FIG. 7 collectively shows the impurity concentration profile along the D-D line and the impurity concentration profile along the E-E line and FIG. 8 collectively shows the potential profile along the D-D line and the potential profile along the E-E line. Moreover, the impurity concentration profile shown in FIG. 7 and the potential profile shown in FIG. 8 are profiles in a depth direction from a first principal surface S1 of a substrate 110.

In the impurity concentration profile shown in FIG. 7 and figures shown thereafter, numbers in the figures correspond to numeral references for semiconductor layers in a solid-state image sensor 100. For example, a number "21" assigned to the impurity concentration profile indicated by a solid line in FIG. 7 means that this profile is the impurity concentration profile of a fourth semiconductor layer 21.

Moreover, in FIGS. 6 to 8 and figures shown thereafter, the same reference numerals are used to represent elements similar to those of the first embodiment, and detailed description thereof will be omitted.

As shown in FIGS. 6 and 7, the solid-state image sensor 100 described in the present variation is different from the solid-state image sensor 100 described in the first embodiment in that the impurity concentration of a fifth semiconductor layer 22a of a first region 32 is lower than the impurity concentration of the fourth semiconductor layer 21 of an APD 31.

With this configuration, a depletion layer extends more to a first semiconductor layer 10 around the first region 32 than around the APD 31. As a result, an electric field to be applied to an avalanche multiplication region 33 of the APD 31 can be, as shown in FIG. 8, set higher than an electric field to be applied to an avalanche multiplication region 34 of the first region 32. With this configuration, advantageous effects similar to those provided by the configuration described in the first embodiment can be provided. That is, electric field concentration at an end portion of the pixel array portion 120 can be relaxed, and stable operation of the APD 31 and therefore stable operation of the solid-state image sensor 100 can be achieved. Moreover, a first reverse bias V1 and a second reverse bias V2 can be the same value as each other, and therefore, the number of power sources can be reduced and an increase in the cost for the solid-state image sensor 100 can be suppressed.

Note that in the present variation, the impurity concentration of the fifth semiconductor layer 22a is set lower than the impurity concentration of the fourth semiconductor layer 21, and in this manner, an electric field to be applied to a PN junction in the APD 31 is set higher than an electric field to be applied to a PN junction in the first region 32. However, the impurity concentration of the first semiconductor layer 10 around the first region 32 may be set lower than the impurity concentration of the first semiconductor layer 10 around the APD 31, for example. Needless to say, this configuration also provides advantageous effects similar to those provided by the configuration described in the present variation.

The present disclosure is not limited to above, and each of the impurity concentrations of the fourth semiconductor layer 21, the fifth semiconductor layer 22a, the first semiconductor layer 10 around the APD 31, and the first semiconductor layer 10 around the first region 32 is properly adjusted so that the absolute value of the breakdown voltage of the first region 32 can be set greater than the absolute value of the breakdown voltage of the APD 31. With this configuration, the electric field to be applied to the PN junction in the APD 31 can be also set higher than the electric field to be applied to the PN junction in the first region 32. Moreover, electric field concentration at the end portion of the pixel array portion 120 can be relaxed, and stable operation of the APD 31 and therefore stable operation of the solid-state image sensor 100 can be achieved.

<Second Variation>

Figure 9:
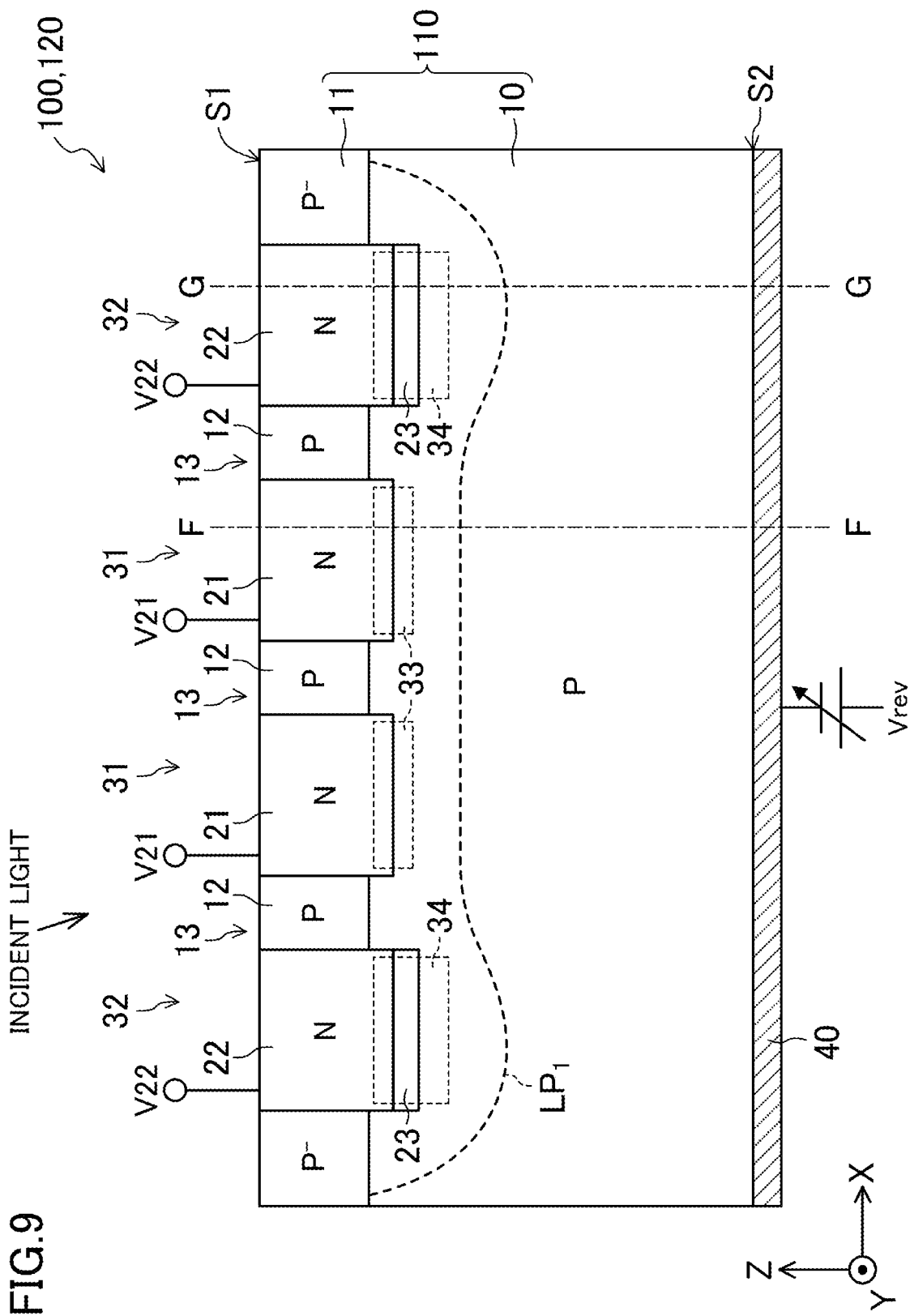
FIG. 9 shows a schematic sectional view of a pixel array portion according to a second variation.
Figure 10:
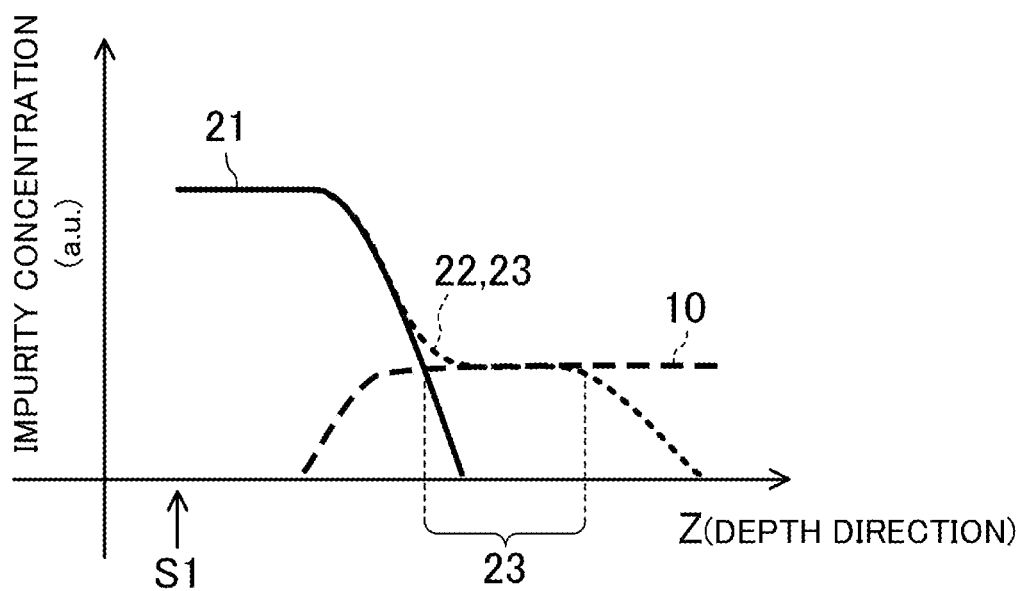
FIG. 10 shows impurity concentration profiles along an F-F line and a G-G line of FIG. 9.

FIG. 9 shows a schematic sectional view of a pixel array portion according to the present variation, and FIG. 10 shows impurity concentration profiles along an F-F line and a G-G line of FIG. 9. Note that FIG. 9 is a view corresponding to FIG. 3.

Note that FIG. 10 collectively shows the impurity concentration profile along the F-F line and the impurity concentration profile along the G-G line. Moreover, the impurity concentration profile shown in FIG. 10 is a profile in a depth direction from a first principal surface S1 of a substrate 110.

As shown in FIG. 9, a solid-state image sensor 100 described in the present variation is different from the solid-state image sensor 100 described in the first embodiment in that a sixth semiconductor layer 23 is formed at a portion contacting, below a fifth semiconductor layer 22 of a first region 32, the fifth semiconductor layer 22.

As shown in FIG. 9, the sixth semiconductor layer 23 is a carrier compensation layer formed in such a manner that an n-type impurity is injected into a first semiconductor layer 10 to the substantially same extent as that of a p-type impurity. Thus, in the sixth semiconductor layer 23, an effective p-type impurity concentration is decreased, and a PN junction boundary in the first region 32 is positioned inside the substrate 110 with respect to a PN junction boundary in an APD 31. As described above, the fifth semiconductor layer 22 and the sixth semiconductor layer 23 are continuous to each other, and therefore, FIG. 10 shows the n-type impurity concentration profiles of these layers as one curve. Moreover, the area of the sixth semiconductor layer 23 is also shown along the horizontal axis.

Since the PN junction boundary in the first region 32 is positioned inside the substrate 110 with respect to the PN junction boundary in the APD 31, variation in the separation characteristics of a separation region 13 can be reduced while an electric field to be applied to the PN junction in the APD 31 is set higher than an electric field to be applied to the PN junction in the first region 32. This will be further described.

Use of a not-shown resist mask pattern upon formation of a fourth semiconductor layer 21 and the fifth semiconductor layer 22 has been already described. In a case where the fourth semiconductor layer 21 and the fifth semiconductor layer 22 are different from each other in an impurity concentration as described in the first variation, resist mask patterns for injecting an n-type impurity are separately formed for the APD 31 and the first region 32 in many cases.

In this case, there has been a probability that the effective impurity concentration of the separation region 13 contacting the fourth semiconductor layer 21 or the fifth semiconductor layer 22 unintentionally changes due to, e.g., influence of mask positional misalignment in the lithography step of forming the resist mask patterns, an electric field becomes higher in the separation region 13, and desired separation characteristics cannot be obtained.

In the present variation, a resist mask pattern for forming the fourth semiconductor layer 21 and the fifth semiconductor layer 22 and a resist mask pattern for forming the sixth semiconductor layer 23 are also separately formed.

However, according to the present variation, the concentration of the n-type impurity injected to form the sixth semiconductor layer 23 is lower than the n-type impurity concentrations of the fourth semiconductor layer 21 and the fifth semiconductor layer 22, and such an n-type impurity is injected into a position deeper than the separation region 13. With this configuration, influence on an electric field and a separation barrier in the separation region 13 can be reduced, and variation in the separation characteristics of the separation region 13 can be reduced. As in the first embodiment and the first variation, electric field concentration at an end portion of the pixel array portion 120 can be relaxed, and stable operation of the APD 31 and therefore stable operation of the solid-state image sensor 100 can be achieved.

In the solid-state image sensors 100 described in the present variation and the first variation, the absolute value of the breakdown voltage of the first region 32 is set greater than the absolute value of the breakdown voltage of the APD 31. Further, a difference between the absolute value of the breakdown voltage of the first region 32 and the absolute value of the breakdown voltage of the APD 31 is set greater than an excess bias voltage as a difference between a first reverse bias V1 and the absolute value of the breakdown voltage of the APD 31.

The absolute value of a voltage Vrev to be applied to a back electrode 40 is set greater than the absolute value of the breakdown voltage of the APD 31, and therefore, an electron of a photoelectrically-converted carrier is avalanche-multiplied in the APD 31 as described above.

On the other hand, in the first region 32, occurrence of avalanche breakdown is preferably avoided upon photodetection operation. If avalanche breakdown occurs in the first region 32, great current flows in the first region 32 even without an output signal, and the power consumption of the solid-state image sensor 100 unintentionally increases. Moreover, the first region 32 generates heat, leading to influence on the characteristics of the APD 31 and the separation characteristics of the separation region 13 and degradation of the performance of the solid-state image sensor 100.

Since the difference between the absolute value of the breakdown voltage of the first region 32 and the absolute value of the breakdown voltage of the APD 31 is set as described above, occurrence of avalanche breakdown can be avoided in the first region 32 upon photodetection operation of the solid-state image sensor 100. With this configuration, an unnecessary increase in the power consumption and unnecessary heat generation can be reduced, and the solid-state image sensor 100 can be stably operated.

Second Embodiment

[Planar Configuration of Pixel Array Portion]

Figure 11:
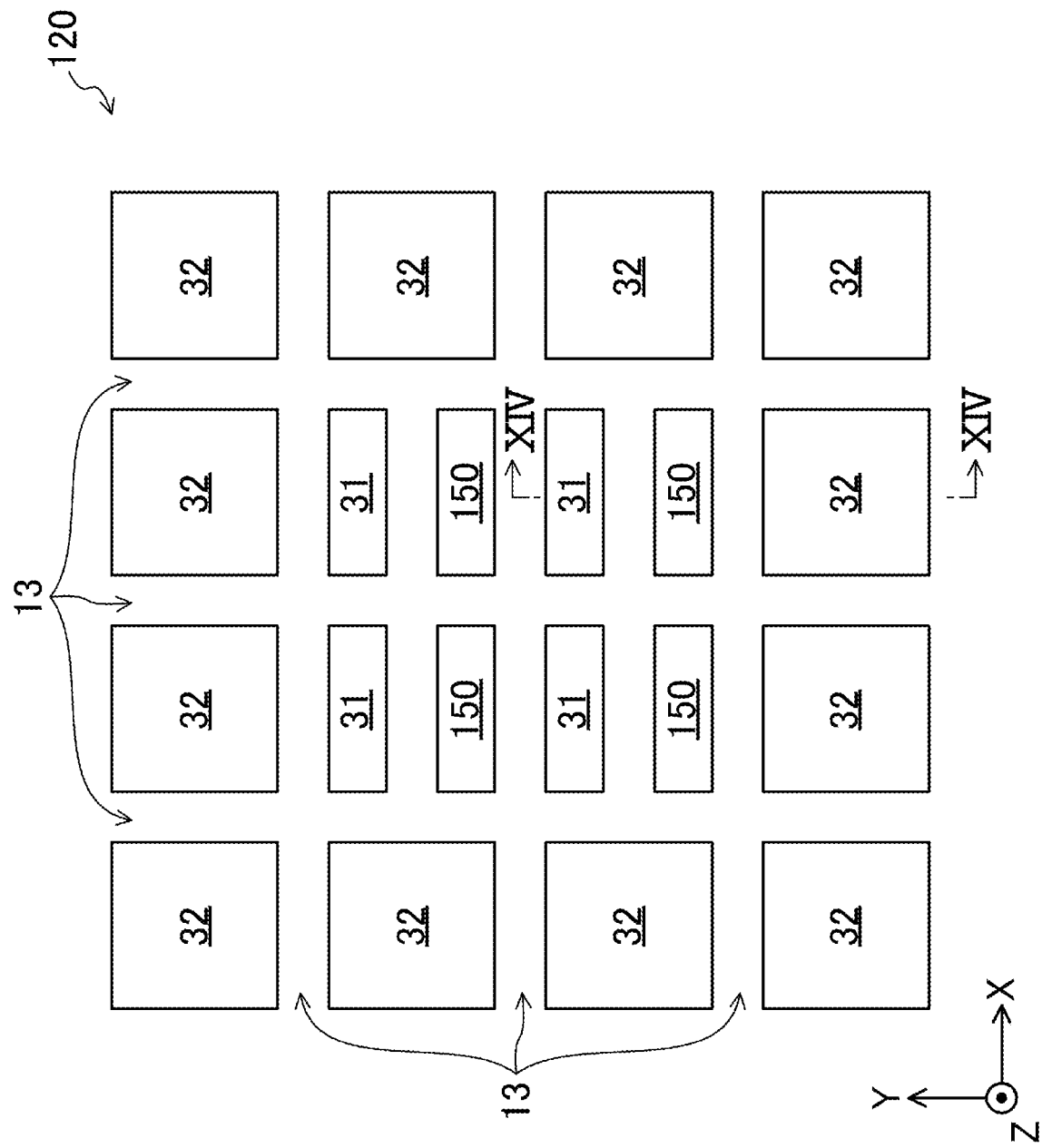
FIG. 11 shows a plan view of a pixel array portion according to a second embodiment.

FIG. 11 shows a plan view of a pixel array portion according to the present embodiment.

A solid-state image sensor 100 described in the present embodiment is different from the solid-state image sensor 100 described in the first embodiment in that the pixel array portion 120 includes pixel circuit regions 150.

As shown in FIG. 11, the pixel circuit regions 150 are each provided corresponding to APDs 31. The APDs 31 and the pixel circuit regions 150 are alternately arranged along a Y-direction, and first regions 32 are arranged outside the APDs 31 and the pixel circuit regions 150. Moreover, separation regions 13 are formed between adjacent ones of the APDs 31 and the pixel circuit regions 150, between adjacent ones of the first regions 32 and the pixel circuit regions 150, and between adjacent ones of the APDs 31 and the first regions 32. Further, separation regions 13 are also formed between adjacent ones of the APDs 31 and between adjacent ones of the first regions 32. With the separation regions 13, adjacent ones of the APDs 31 and the pixel circuit regions 150 are electrically separated from each other as in the first embodiment.

As described later, a pixel circuit is formed inside the pixel circuit region 150 (see FIG. 14). Moreover, in an example shown in FIG. 11, the pixel circuit region 150 is provided for each APD 31. However, one pixel circuit region 150 may be provided corresponding to a plurality of APDs 31. The details of the configuration of the pixel circuit region 150 will be described later.

[Circuit Configuration and Operation of Solid-State Image Sensor]

Figure 13:
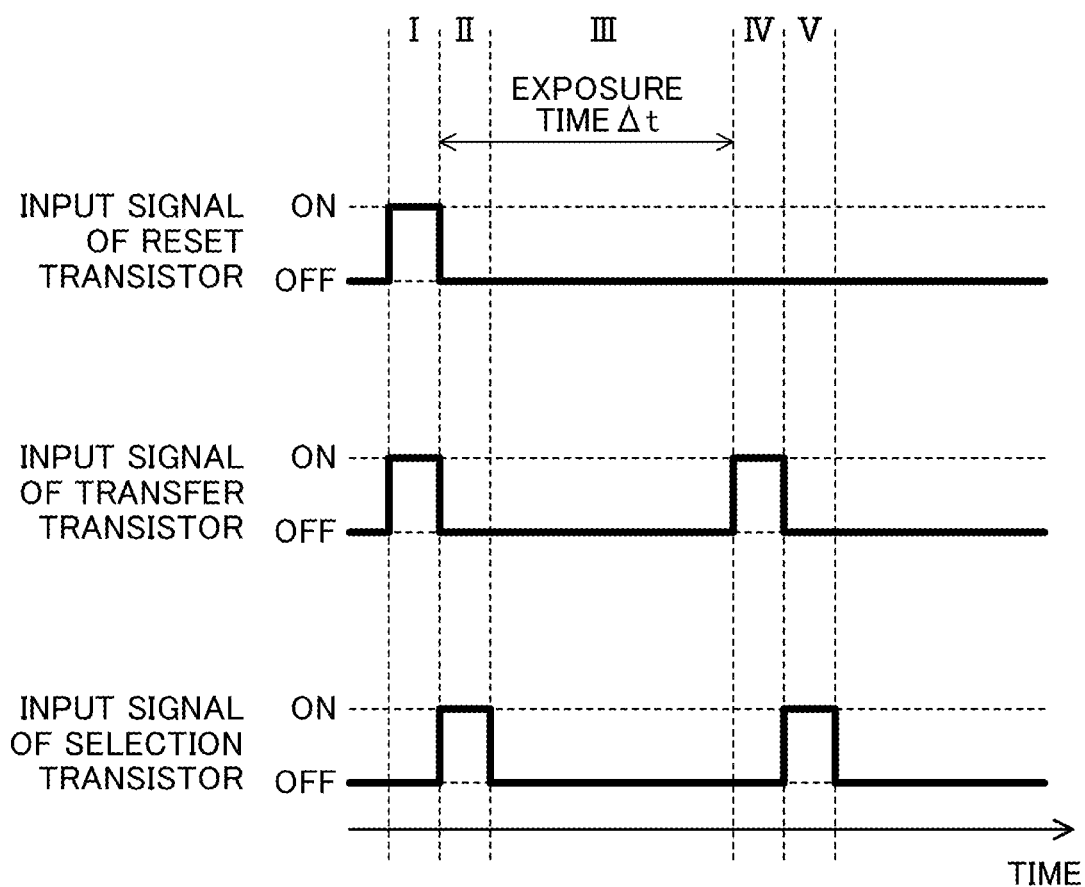
FIG. 13 shows one example of a pixel circuit drive timing chart.

FIG. 12 shows a circuit configuration of the solid-state image sensor according to the present embodiment, and FIG. 13 shows one example of a pixel circuit drive timing chart.

As shown in FIG. 12, the solid-state image sensor 100 includes, around the pixel array portion 120, a reading circuit 131, a horizontal scanning circuit 132, a buffer amplifier 133, and a vertical scanning circuit 141. The reading circuit 131, the horizontal scanning circuit 132, and the buffer amplifier 133 are equivalent to the first peripheral circuit portions 130 shown in FIG. 1, and the vertical scanning circuit 141 is equivalent to the second peripheral circuit portion 140.

The pixel array portion 120 is, for each pixel, provided with a photodetection unit 201, a transfer transistor 202, a reset transistor 203, a source-follower transistor 204, a selection transistor 205, and a floating diffusion capacitor (floating diffusion) 206.

The photodetection unit 201 is equivalent to the APD 31 shown in FIG. 2. Moreover, the transfer transistor 202, the reset transistor 203, the source-follower transistor 204, the selection transistor 205, and the floating diffusion capacitor 206 are equivalent to the pixel circuit, and are formed in the pixel circuit region 150 shown in FIG. 11. Note that the pixel circuit shown in FIG. 12 is merely an example and other configurations may be employed as necessary according to, e.g., the specifications of the solid-state image sensor 100.

The transfer transistor 202 transfers a charge output from the photodetection unit 201 to the floating diffusion capacitor 206, and the floating diffusion capacitor 206 accumulates such a charge. The reset transistor 203 resets the potential of the floating diffusion capacitor 206 to a predetermined potential. The potential of the floating diffusion capacitor 206 according to the accumulated charge amount is input to a gate of the source-follower transistor 204, and the source-follower transistor 204 outputs an amplified signal. The selection transistor 205 transfers, to a vertical signal line 208 connected to the reading circuit 131, the amplified signal output from the source-follower transistor 204.

Hereinafter, operation of the solid-state image sensor 100 will be described also with reference to FIG. 13.

In a reset period (a period I shown in FIG. 13), signals are input to a gate of the reset transistor 203 and a gate of the transfer transistor 202 from the vertical scanning circuit 141, and the reset transistor 203 and the transfer transistor 202 are turned on.

A drain of the reset transistor 203 is connected to a horizontal signal line 207 connected to the vertical scanning circuit 141, and when the reset transistor 203 is turned on, the potential of the floating diffusion capacitor 206 is reset to the drain potential of the reset transistor 203. Moreover, the transfer transistor 202 connected to the floating diffusion capacitor 206 is also in an ON state, and therefore, the photodetection unit 201 is also reset to the drain potential of the reset transistor 203.

Next, the reset transistor 203 and the transfer transistor 202 are turned off, and a signal is input to a gate of the selection transistor 205 from the vertical scanning circuit 141 to turn on the selection transistor 205. The potential of a floating diffusion region right after reset is transferred to the reading circuit 131 through the source-follower transistor 204, the selection transistor 205, and the vertical signal line 208, and as a first signal, is saved in a not-shown memory etc. The memory etc. are often provided in the reading circuit 131 (a clamp period: a period II shown in FIG. 13).

After the end of the reset period, when light enters the photodetection unit 201, an electron generated by photoelectric conversion is avalanche-multiplied, and is accumulated in the photodetection unit 201, specifically the fourth semiconductor layer 21 shown in FIG. 3. A period in which the electron is accumulated after the light has entered the photodetection unit 201 is an exposure time, and is equal to the sum of the period II and a period III shown in FIG. 13.

After the end of the exposure period, the transfer transistor 202 is turned on again, and the electron accumulated in the photodetection unit 201 is transferred to the floating diffusion capacitor 206 (a transfer period: a period IV shown in FIG. 13).

Next, the transfer transistor 202 is turned off, and the selection transistor 205 is turned on. The potential of the floating diffusion region in a state in which the electron is accumulated is, as a second signal, transferred to the reading circuit 131 through the source-follower transistor 204, the selection transistor 205, and the vertical signal line 208. A difference between the second signal and the first signal acquired in the clamp period is taken to generate a pixel signal (a reading period: a period V shown in FIG. 13).

Note that the pixel signal is often generated in the reading circuit 131. In this case, the pixel signal is sent to the buffer amplifier 133 by the horizontal scanning circuit 132, and is further output to the outside of the solid-state image sensor 100. Note that the pixel signal may be generated outside the solid-state image sensor 100.

Since the difference between the first signal and the second signal is taken, a noise component such as kTC noise can be removed from the pixel signal, and a high-quality signal can be obtained.

Particularly, in the case of operating the APD 31 in a Geiger multiplication mode, the reset transistor 203 is turned on to apply a voltage V21 to the APD 31 in the period I, and the reset transistor 203 is turned off to disconnect a power source and the APD 31 from each other in the periods II, III for exposure. With this configuration, the APD 31 is brought into a floating state, a charge generated by avalanche multiplication is accumulated in a capacitor C connected to a cathode of the APD 31, a reverse bias to be applied to a multiplication region of the APD 31 is relaxed, and avalanche multiplication is stopped. That is, the APD 31 of the present disclosure is, upon photodetection, at least temporarily connected only to the capacitor C, and the connected capacitor C serves as a quenching element of the APD 31 (see FIG. 24). The capacitor C described herein includes, for example, a PN junction capacitor in the multiplication region of the APD 31 and the separation region 13, a wiring capacitor, and a fringe capacitor between transistors connected in series. Alternatively, a configuration may be employed, in which a quenching resistor R (see FIG. 24) is connected to the first region 32, the APD 31 is quenched by the capacitor C, and the first region 32 is quenched by the resistor R. The quenching resistor R described herein includes, for example, a wiring resistor, a contact resistor, and a polysilicon resistor.

FIG. 11 shows the configuration in which the reading circuit 131 is provided on the same substrate as that for the APD 31 and the first region 32, but the reading circuit 131 may be provided on another semiconductor substrate and wafers may be joined to each other. In this case, the substrate voltage of the semiconductor substrate on which the reading circuit 131 is provided may be different from the substrate voltage (Vrev) of the semiconductor substrate on which the APDs 31 and the first regions 32 are provided. In this case, a reverse bias to be applied to a well of the reading circuit 131 decreases, and current can be reduced.

[Sectional Configuration of Pixel Array Portion]

Figure 14:
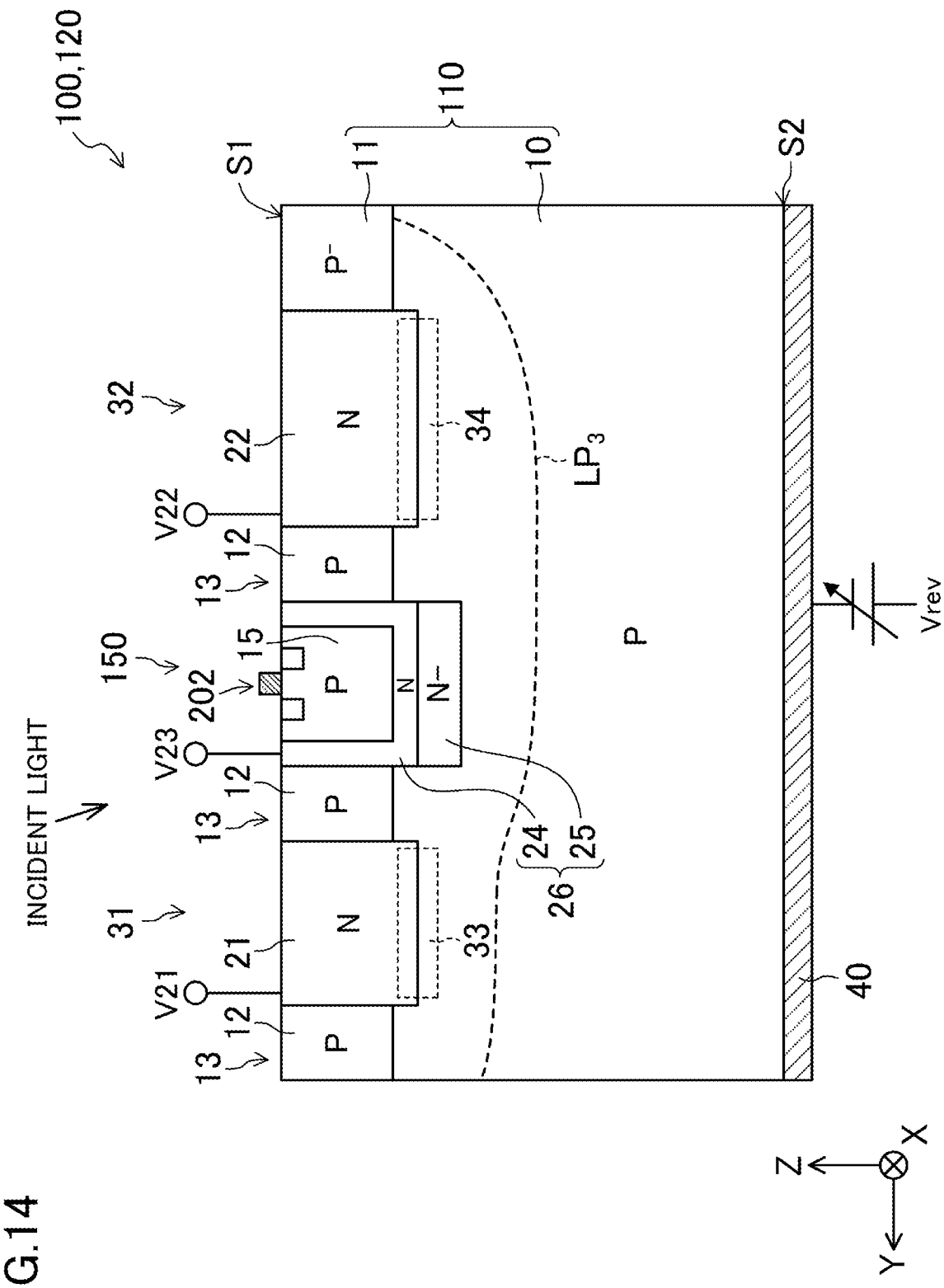
FIG. 14 shows a schematic sectional view along an XIV-XIV line of FIG. 11.
Figure 15:
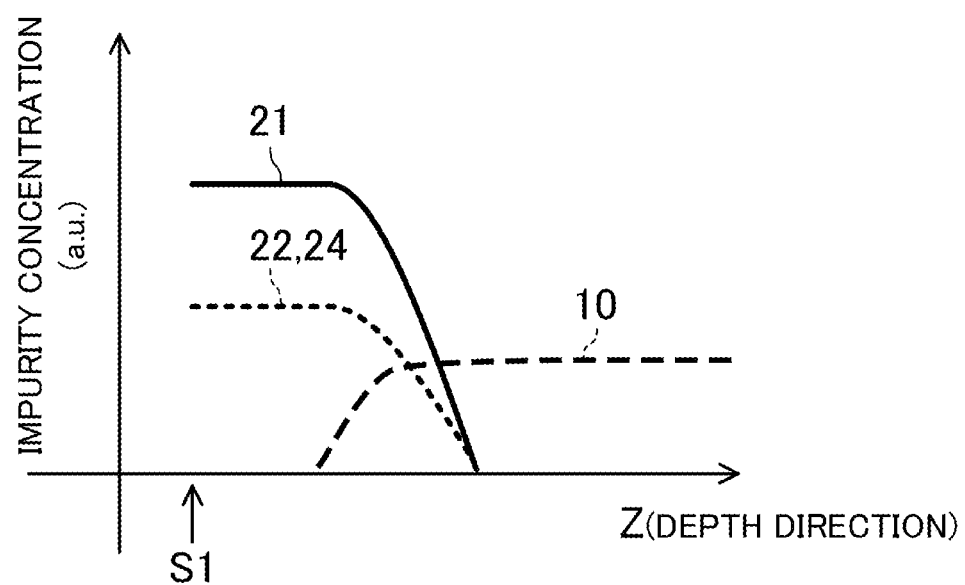
FIG. 15 shows the impurity concentration profile of each portion of the pixel array portion.

FIG. 14 shows a schematic sectional view along an XIV-XIV line of FIG. 11, and FIG. 15 shows the impurity concentration profile of each portion of the pixel array portion. The impurity concentration profiles shown in FIG. 15 are profiles in a Z-direction. Moreover, FIG. 15 collectively shows the impurity concentration profiles of the APD 31, the first region 32, and the pixel circuit region 150.

Of the pixel array portion 120 shown in FIG. 14, the APD 31 and the first region 32 have structures similar to those described in the first variation, and show impurity concentration profiles similar to those shown in FIG. 7. Thus, the absolute value of the breakdown voltage of the first region 32 is greater than the absolute value of the breakdown voltage of the APD 31.

On the other hand, in the pixel circuit region 150, an N-well 26 is formed as a circuit well. A p-type ninth semiconductor layer 15 is formed inside the N-well 26, and the transfer transistor 202 shown in FIG. 12 is formed on the ninth semiconductor layer 15. The transfer transistor 202 is an N-channel transistor, and the ninth semiconductor layer 15 functions as a P-well for such a transistor. Note that although not shown in the figure, the reset transistor 203, the source-follower transistor 204, the selection transistor 205, and the floating diffusion capacitor 206 are also formed in the pixel circuit region 150.

The N-well 26 includes an n-type seventh semiconductor layer 24 and an n-type eighth semiconductor layer 25 contacting the seventh semiconductor layer 24, and the n-type impurity concentration of the eighth semiconductor layer 25 is set lower than the n-type impurity concentration of the seventh semiconductor layer 24. As clearly seen from FIGS. 14 and 15, the depth of the fifth semiconductor layer 22 and the depth of the seventh semiconductor layer 24 are set equal to each other with respect to a first principal surface S1. Moreover, the n-type impurity concentration of the fifth semiconductor layer 22 and the n-type impurity concentration of the seventh semiconductor layer 24 are set equal to each other. Further, a well voltage V23 is applied to the N-well 26.

In the solid-state image sensor 100 described in the present embodiment, the eighth semiconductor layer 25 is provided in the N-well 26, and therefore, a p-type depletion layer end $LP_3$ is wider below the N-well 26 (see FIG. 14). Moreover, a potential gradient in the Z-direction from the eighth semiconductor layer 25 to a first semiconductor layer 10 is smaller than a potential gradient in the Z-direction from the fourth semiconductor layer 21 of the APD 31 to the first semiconductor layer 10. Thus, the absolute value of the breakdown voltage between the N-well 26 and the first semiconductor layer 10 is greater than the absolute value of the breakdown voltage of the APD 31.

With this configuration, occurrence of breakdown between the N-well 26 and the first semiconductor layer 10 can be reduced during photodetection operation. Moreover, occurrence of punch-through among the ninth semiconductor layer 15, the N-well 26, and the first semiconductor layer 10 can be reduced.

In the pixel circuit, the well voltage V23 to be applied to the N-well 26 needs to be about the drive power-source voltage of the transistor for operating each transistor. Moreover, each transistor needs to be operated regardless of the level of the voltage Vrev to be applied to the back electrode 40.

Thus, when breakdown or punch-through as described above occurs, the pixel circuit is not normally operated, and photodetection cannot be performed.

On the other hand, according to the present embodiment, the N-well 26 has the above-described structure so that occurrence of breakdown or punch-through as described above can be reduced, the pixel circuit can be normally operated, and photodetection operation can be stably performed.

Note that other than the structure shown in FIG. 14, the absolute value of the breakdown voltage between the N-well 26 and the first semiconductor layer 10 can be greater than the absolute value of the breakdown voltage of the APD 31. For example, the N-well 26 many include only the seventh semiconductor layer 24. In this case, the depth of the seventh semiconductor layer 24 may be set such that the seventh semiconductor layer 24 reaches a lower surface of the eighth semiconductor layer 25 shown in FIG. 14. With this configuration, a distance between a lower surface of the N-well 26 and the separation region 13 can be ensured, and influence of the N-well 26 on the electric characteristics of the separation region 13 can be reduced. Note that the same also applies to the structure shown in FIG. 14.

In this case, the depth of the N-well 26 and the depth of the fifth semiconductor layer 22 of the first region 32 are preferably equal to each other. That is, in the Z-direction, a PN junction boundary between the seventh semiconductor layer 24 forming the N-well 26 and the first semiconductor layer 10 is preferably at the same position as a PN junction boundary between the fifth semiconductor layer 22 and the first semiconductor layer 10. Moreover, the n-type impurity concentration of the seventh semiconductor layer 24 and the n-type impurity concentration of the fifth semiconductor layer 22 are preferably equal to each other.

With this configuration, the absolute value of the breakdown voltage between the N-well 26 and the first semiconductor layer 10 can be greater than the absolute value of the breakdown voltage of the APD 31. Accordingly, occurrence of breakdown in the first region 32 or the N-well 26 can be reduced, and occurrence of punch-through in the pixel circuit region 150 can be reduced.

The fifth semiconductor layer 22 and the N-well 26 can be simultaneously formed during the step of manufacturing the solid-state image sensor 100, and therefore, an increase in the cost for manufacturing the solid-state image sensor 100 can be suppressed. The same also applies to the structure shown in FIG. 14.

<Third Variation>

Figure 16A:
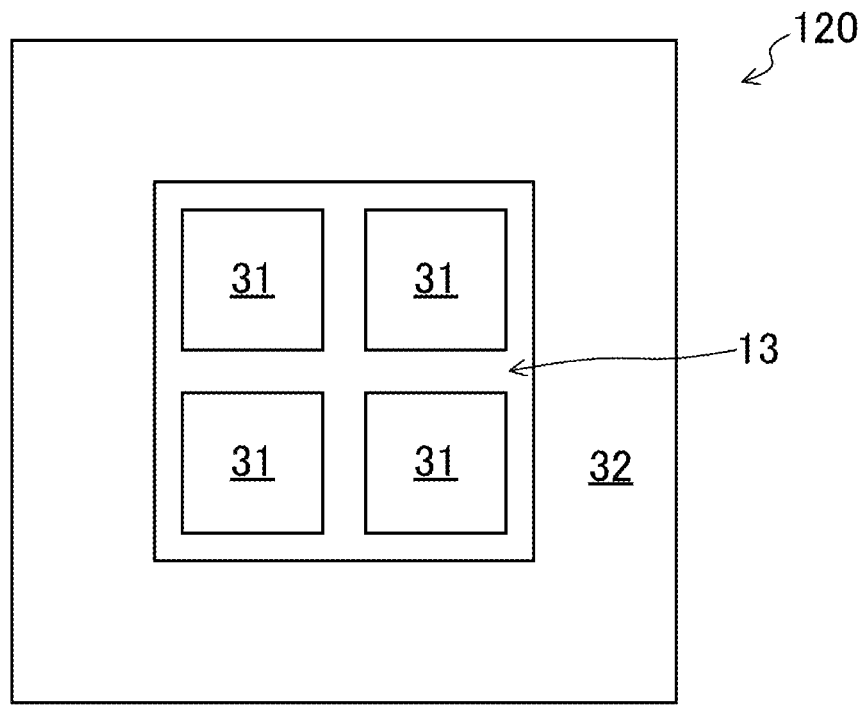
FIG. 16A shows a plan view of a pixel array portion according to a third variation.
Figure 16B:
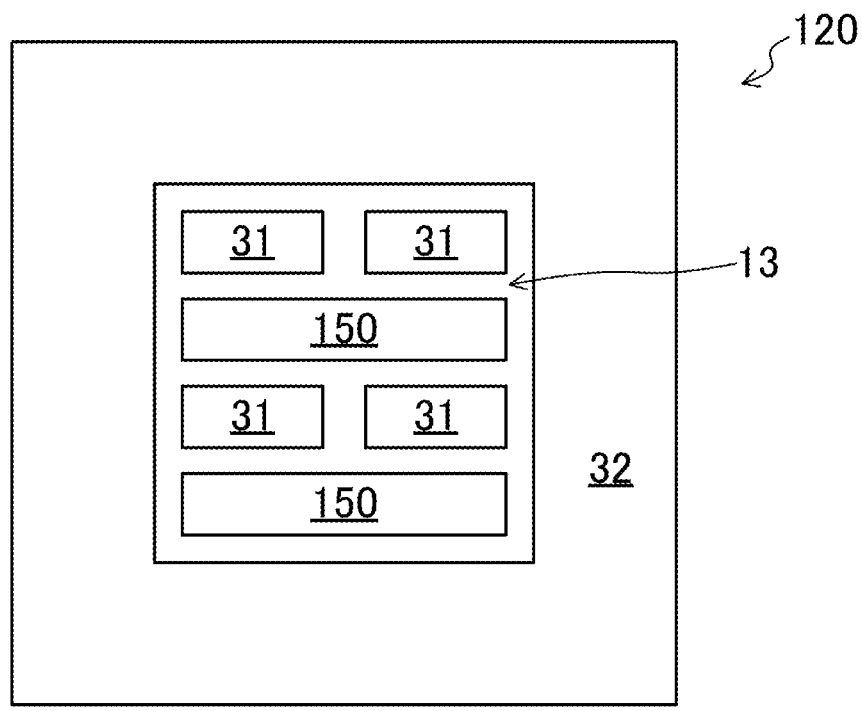
FIG. 16B shows a plan view of another pixel array portion according to the third variation.

FIG. 16A shows a plan view of a pixel array portion according to the present variation, and FIG. 16B shows a plan view of another pixel array portion.

The pixel array portions 120 shown in FIGS. 16A and 16B are different from the pixel array portions 120 described in the first and second embodiments in that a first region 32 is integrally provided in a frame shape surrounding APDs 31 as viewed in plane. Moreover, the pixel array portion 120 shown in FIG. 16B is different from the pixel array portion 120 described in the second embodiment in that a pixel circuit region 150 is provided for two adjacent APDs 31.

In the case of applying the same voltage to a plurality of first regions 32, a separation region 13 is not necessarily provided between the first regions 32. Thus, the first regions 32 may be integrally formed as shown in FIGS. 16A and 16B.

In a case where a well voltage V23 to be applied to an N-well 26 in the pixel circuit region 150 can be set equal among pixels, the separation region 13 is not necessarily provided between the pixel circuit regions 150 of adjacent ones of the pixels, and the pixel circuit regions 150 may be integrated. With this configuration, the effective occupied area ratio of the pixel circuit region 150 in the pixel array portion 120 can be reduced, and the occupied area ratio of the APDs 31 can be increased. Accordingly, the photon detection efficiency of the solid-state image sensor 100 can be enhanced.

Note that FIGS. 16A and 16B show the examples where the frame-shaped first region 32 surrounds four APDs 31, but the present disclosure is not particularly limited to these examples. For example, the frame-shaped first region 32 may surround one APD 31.

Needless to say, the structure described in the first embodiment and the structures described in the first and second variations can be applied as the structures of the APD 31 and the first region 32.

<Fourth Variation>

Figure 17:
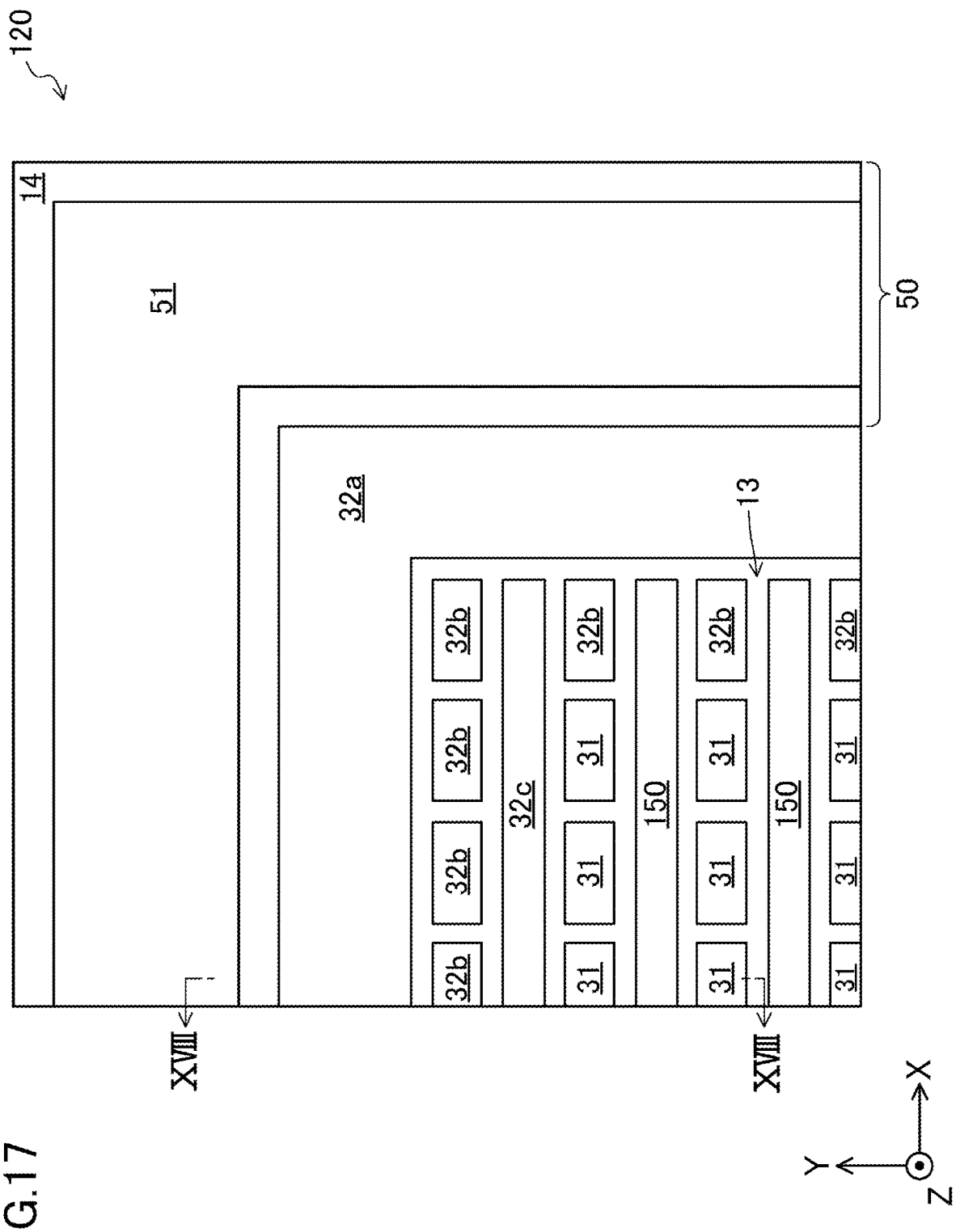
FIG. 17 shows a plan view of a pixel array portion and an electric field relaxing region according to a fourth variation.
Figure 18:
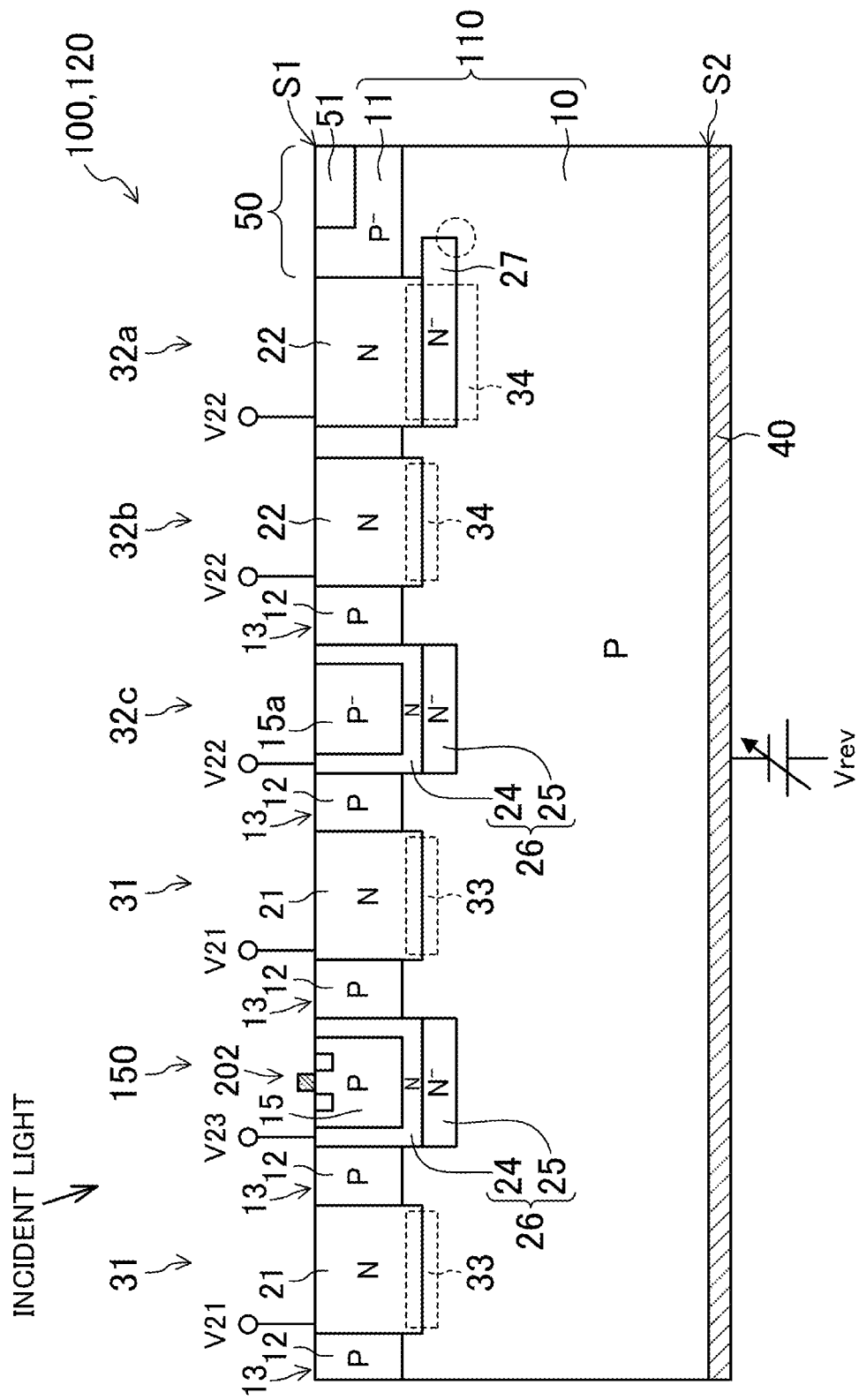
FIG. 18 shows a schematic sectional view along an XVIII-XVIII line of FIG. 17.

FIG. 17 shows a plan view of a pixel array portion and an electric field relaxing region according to the present variation, and FIG. 18 shows a schematic sectional view along an XVIII-XVIII line of FIG. 17.

A solid-state image sensor 100 described in the present variation is different from the solid-state image sensors 100 described in the first and second embodiments in that the electric field relaxing region 50 is provided outside the pixel array portion 120 and first regions 32 include a frame-shaped region 32a, dummy APDs 32b, and dummy pixel circuit regions 32c. Thus, these portions are provided so that an APD 31 and a pixel circuit can be stably operated as described above.

Note that in an example shown in FIG. 17, the first regions 32 in different planar patterns are formed considering a pattern periodicity in the pixel array portion 120. For example, the frame-shaped region 32a is provided at an outer peripheral portion of the pixel array portion 120. Moreover, the dummy pixel circuit region 32c extending in an X-direction is, along a Y-direction, provided between the dummy APD 32b and the next APD 31 adjacent to such a dummy APD 32b.

As shown in FIG. 18, in the frame-shaped region 32a positioned at the outermost periphery of the pixel array portion 120, an n-type tenth semiconductor layer 27 is provided between a fifth semiconductor layer 22 and a first semiconductor layer 10.

The tenth semiconductor layer 27 is formed at the same time as formation of an eighth semiconductor layer 25 of an N-well 26. That is, the n-type impurity concentration of the tenth semiconductor layer 27 is equal to the n-type impurity concentration of the eighth semiconductor layer 25, and in this case, is set lower than the n-type impurity concentration of the fifth semiconductor layer 22. Moreover, the tenth semiconductor layer 27 extends to project to the outside of the pixel array portion 120, i.e., the side opposite to an adjacent APD 31, in the vicinity of a surface joined to the first semiconductor layer 10.

In the lithography step of forming the N-well 26 in a pixel circuit region 150, a not-shown resist mask pattern is formed. As shown in FIG. 17, the pixel circuit region 150 is a pattern elongated in the X-direction. Thus, the above-described resist mask pattern is also an opening pattern elongated in the X-direction, and in some cases, the shape thereof is not stable due to stress applied in the X-direction upon pattern formation. As described in the present variation, the frame-shaped region 32a is provided in the vicinity of end portions of the resist mask pattern, which is provided for forming the N-well 26 in the pixel circuit region 150, in the X-direction. Thus, the stress applied to such a resist mask pattern in the X-direction can be relaxed, and a pattern break can be reduced. Accordingly, the area and depth of the N-well 26 can be stabilized, variation in circuit characteristics in the pixel circuit region 150 can be reduced, and the performance of the solid-state image sensor 100 can be stabilized.

The above-described tenth semiconductor layer 27 is provided in the frame-shaped region 32a positioned at the outermost periphery of the pixel array portion 120, and therefore, electric field concentration can be more relaxed at an end portion of the pixel array portion 120. Of the tenth semiconductor layer 27, a corner portion surrounded by a dashed circle mark is a portion at which electric field concentration is likely to occur. The n-type impurity concentration of the tenth semiconductor layer 27 is decreased so that electric field concentration can be more relaxed at such a portion. The tenth semiconductor layer 27 is positioned inside a substrate 110 with respect to the fifth semiconductor layer 22, and therefore, influence of electric field concentration at the above-described corner portion is less likely to be provided to a separation region 13 or the electric field relaxing region 50. Thus, separation characteristics between the APDs 31 and the effect of relaxing electric field concentration at the end portion of the pixel array portion 120 are maintained.

As in the first region 32 shown in FIG. 2, the dummy APD 32b has the same size as the APD 31 as viewed in plane, and shows an impurity profile similar to that of the APD 31. Note that the dummy APD 32b does not contribute to photodetection. As shown in FIG. 17, the plurality of dummy APDs 32b is provided among the frame-shaped region 32a and the APDs 31, and therefore, the periodicity of the plurality of APDs 31 arranged in an array is held. Accordingly, the stress applied to the resist mask pattern for forming a fourth semiconductor layer 21 of the APD 31 positioned at the outermost periphery of an APD array 30 can be relaxed, and a pattern break can be reduced. Consequently, the area and depth of the fourth semiconductor layer 21 can be stabilized, variation in the characteristics of the APD 31 can be reduced, and the performance of the solid-state image sensor 100 can be stabilized.

The dummy pixel circuit region 32c includes an n-type seventh semiconductor layer 24 and a p-type ninth semiconductor layer 15a formed inside the seventh semiconductor layer 24. Note that a transistor is not necessarily formed in the dummy pixel circuit region 32c. The ninth semiconductor layer 15a has an impurity concentration lower than that of the ninth semiconductor layer 15, and has the same impurity concentration as that of a second semiconductor layer 11. As shown in FIG. 17, the dummy pixel circuit region 32c is provided between the dummy APD 32b and the next APD 31 adjacent to such a dummy APD 32b along the Y-direction, and therefore, the periodicity of the plurality of pixel circuit regions 150 formed such that the pixel circuit regions 150 and the APDs 31 are alternately arrayed along the Y-direction is held. With this configuration, the stress applied to the resist mask pattern, which is provided for forming the N-well 26 in the pixel circuit region 150, in the Y-direction can be relaxed, and a pattern break can be reduced. Accordingly, the area and depth of the N-well 26 can be stabilized, variation in the circuit characteristics in the pixel circuit region 150 can be reduced, and the performance of the solid-state image sensor 100 can be stabilized.

Note that arrangement of the first regions 32 is not necessarily always the layout shown in FIG. 17 and may be changed as necessary to such an extent that the planar shapes of the APD 31 and the pixel circuit region 150 and the stability of the APD 31 and the pixel circuit can be ensured. For example, the shape of the frame-shaped region 32a may be changed to an array shape, or the dummy pixel circuit region 32c having the same pattern as that of the pixel circuit region 150 may be omitted.

Note that a reverse bias is applied to each of the frame-shaped region 32a, the plurality of dummy APDs 32b, and the plurality of dummy pixel circuit regions 32c through not-shown wirings or contacts, needless to say.

As shown in FIGS. 17 and 18, the electric field relaxing region 50 is provided outside the pixel array portion 120 to surround the pixel array portion 120. The electric field relaxing region 50 includes the second semiconductor layer 11, and a STI 51 is formed at a large portion of a surface of the electric field relaxing region 50, i.e., the surface on a first principal surface S1 side. The STI 51 is an insulating structure in which an insulator such as a silicon oxide film is embedded in a trench groove formed in the substrate 110 through a first principal surface S1.

The electric field relaxing region 50 is provided as described above so that the width of a depletion layer (not shown) extending to the outside of the frame-shaped region 32a can be further increased. The p-type impurity concentration of the second semiconductor layer 11 is lower than the p-type impurity concentration of the first semiconductor layer 10, and therefore, the depletion layer easily spreads along the X-direction and the Y-direction.

With this configuration, electric field concentration at the end portion of the pixel array portion 120 can be more relaxed as compared to the cases described in the first and second embodiments, and the stability of photodetection operation of the APD 31 and therefore photodetection operation of the solid-state image sensor 100 can be more enhanced.

Note that no silicide is formed on the surface of the electric field relaxing region 50. For improving transistor performance in a first peripheral circuit portion 130 or a second peripheral circuit portion 140, the technique of forming silicide on surfaces of a gate, a source, and a drain of a transistor has been broadly performed, and a general SALICIDE technique is used as such a technique. Note that silicide is a compound of silicon and metal and has a lower resistivity than that of silicon.

In a case where silicide is formed on the surface of the electric field relaxing region 50, generation recombination of a carrier on the surface is likely to occur, and a leakage current flowing in the first region 32 increases. This leads to an unnecessary increase in power consumption and unnecessary heat generation in the solid-state image sensor 100. For preventing such an increase and such heat generation, no silicide is formed on the surface of the electric field relaxing region 50. Because of similar reasons, the surface of the electric field relaxing region 50 is preferably covered with the STI 51. With this configuration, an increase in the leakage current flowing in the first region 32 can be also reduced, and an increase in the power consumption and heat generation can be also reduced.

As shown in FIG. 17, a p-type eleventh semiconductor layer 14 is preferably provided outside the electric field relaxing region 50. This can prevent the depletion layer extending to the electric field relaxing region 50 from reaching the first peripheral circuit portion 130 or the second peripheral circuit portion 140, and accordingly, can prevent influence on each internal circuit.

Figure 19:
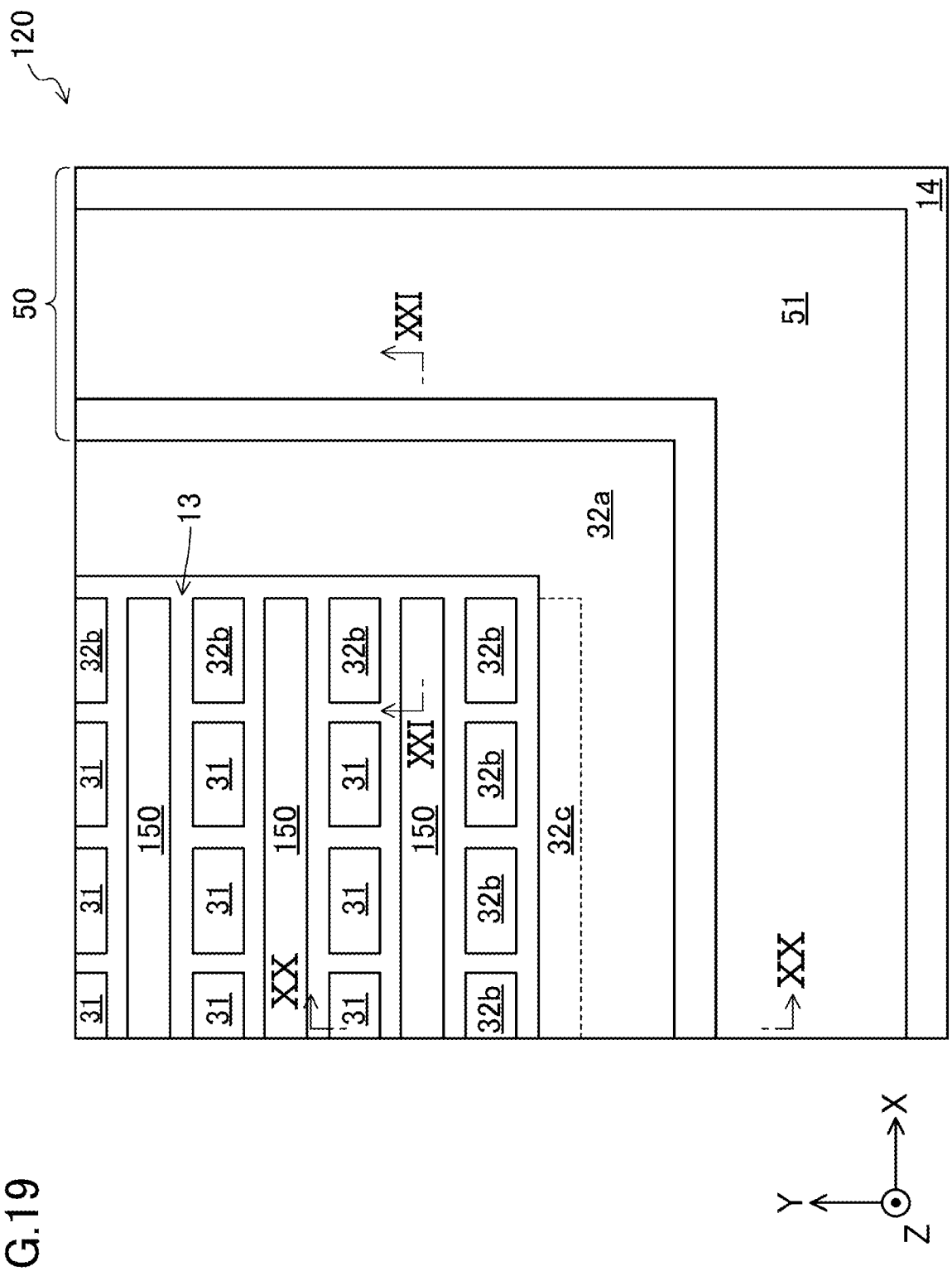
FIG. 19 shows a plan view of another pixel array portion and another electric field relaxing region according to the fourth variation.
Figure 20:
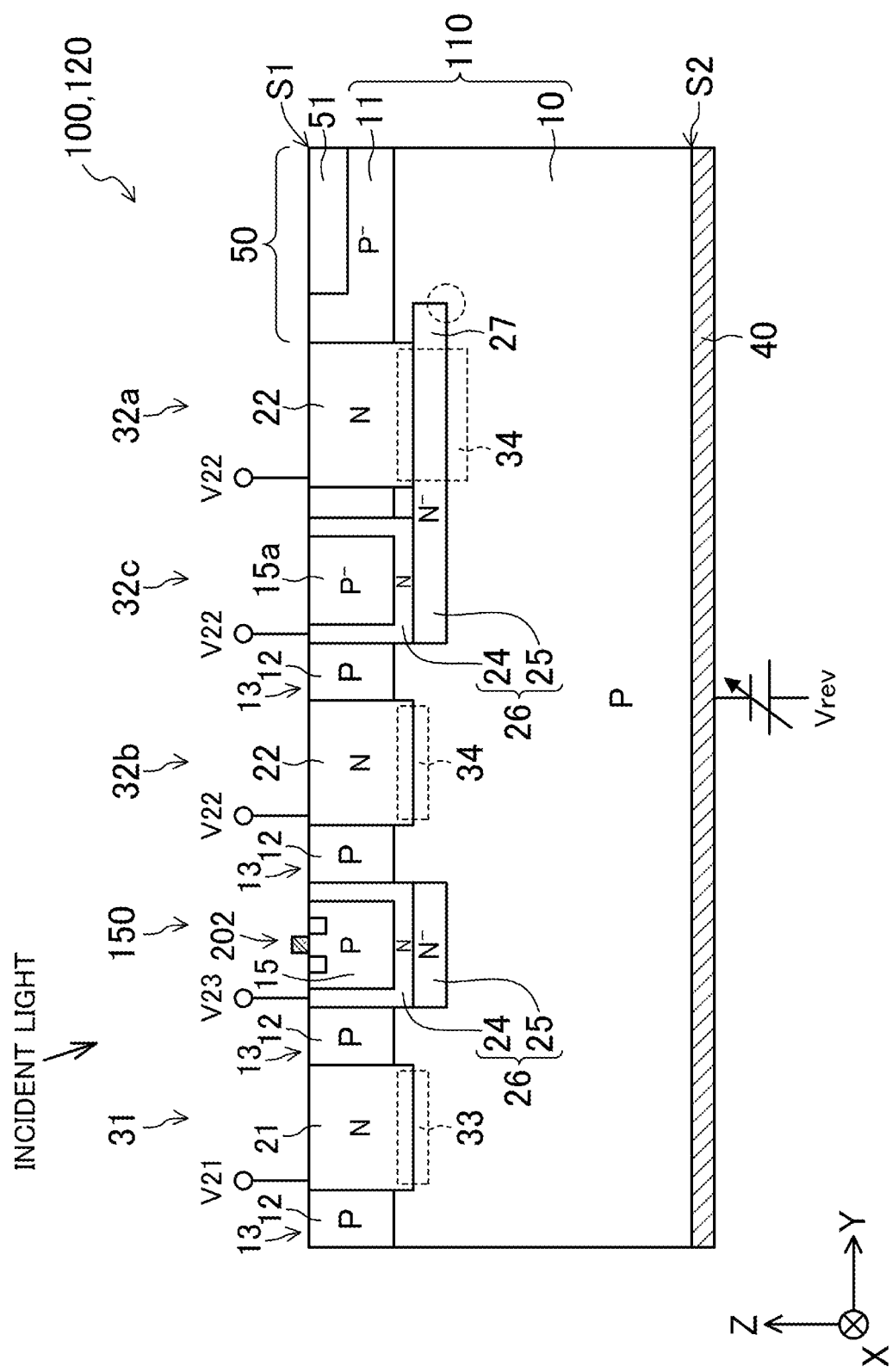
FIG. 20 shows a schematic sectional view along an XX-XX line of FIG. 19.
Figure 21:
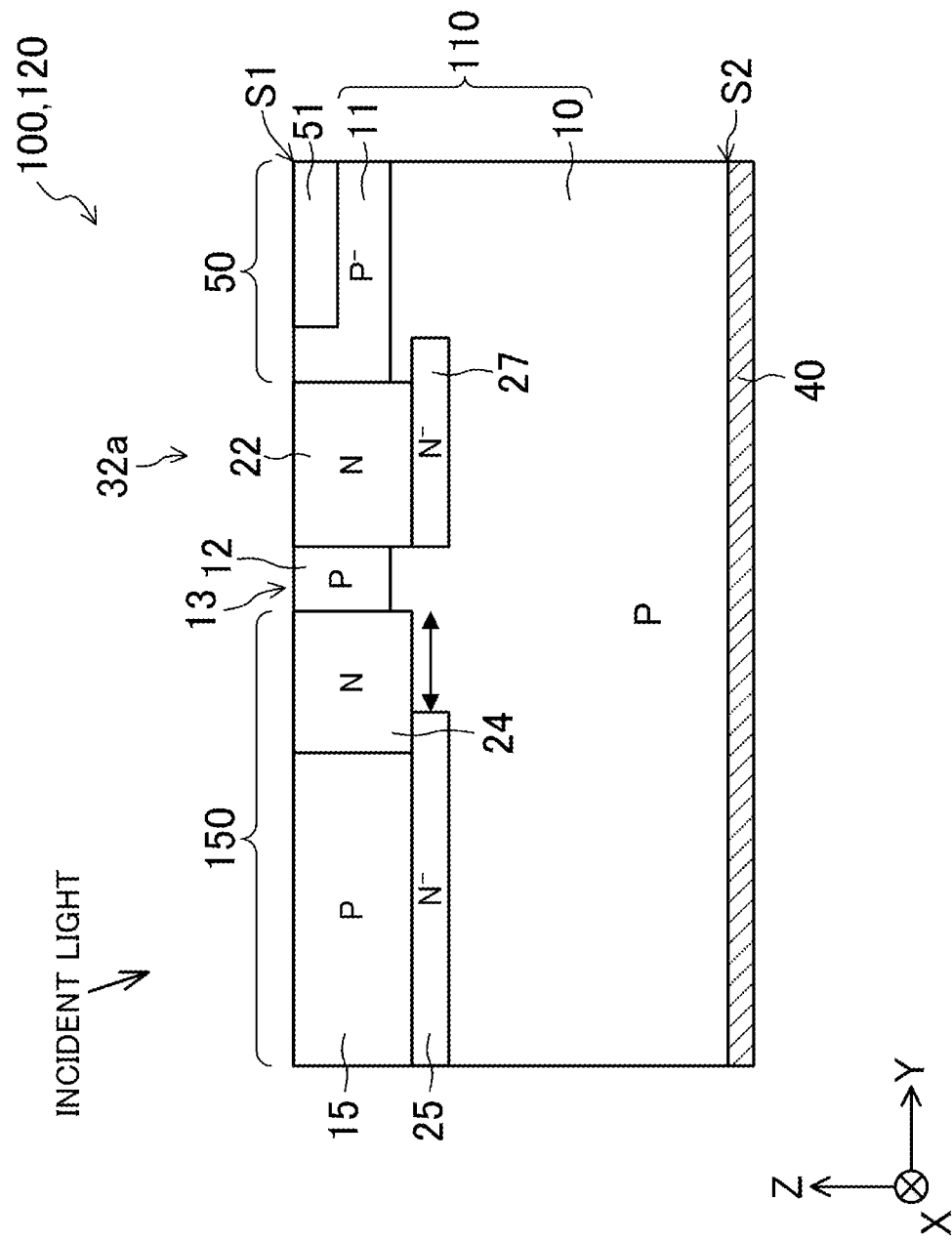
FIG. 21 shows a schematic sectional view along an XXI-XXI line of FIG. 19.

FIG. 19 shows a plan view of another pixel array portion and another electric field relaxing region according to the present variation, FIG. 20 shows a schematic sectional view along an XX-XX line of FIG. 19, and FIG. 21 shows a schematic sectional view along an XXI-XXI line of FIG. 19.

As shown in FIG. 19, the frame-shaped region 32a surrounding the pixel array portion 120 has, on an inner peripheral side thereof, the above-described dummy pixel circuit region 32c. Moreover, the n-type tenth semiconductor layer 27 is integrally formed to contact a lower surface of the n-type seventh semiconductor layer 24 of the dummy pixel circuit region 32c and a lower surface of the fifth semiconductor layer 22 of the frame-shaped region 32a.

The tenth semiconductor layer 27 is integrally formed to extend over the seventh semiconductor layer 24 and the fifth semiconductor layer 22, and therefore, the shape of a resist mask pattern (not shown) for forming the tenth semiconductor layer 27 can be stabilized. In a case where the tenth semiconductor layer 27 is separated below the seventh semiconductor layer 24 of the dummy pixel circuit region 32c and below the fifth semiconductor layer 22, the resist mask pattern needs to be formed long in a line shape, and for this reason, a pattern break is likely to occur. For preventing such a situation, the n-type tenth semiconductor layer 27 is integrally formed as described above.

As shown in FIG. 21, on an outer peripheral side of the pixel circuit region 150, specifically at an end portion of the pixel circuit region 150 in the X-direction, an end portion of the eighth semiconductor layer 25 is, as viewed in plane, formed inside an end portion of the seventh semiconductor layer 24.

Different voltages are applied to the pixel circuit region 150 and the frame-shaped region 32a outside the pixel circuit region 150. A resist mask pattern (not shown) for forming the eighth semiconductor layer 25 is an opening pattern with a large area, and easily loses the shape thereof.

For this reason, as shown in FIG. 21, the separation region 13 is, on the first principal surface S1 side, formed between the pixel circuit region 150 and the frame-shaped region 32a. The end portion of the eighth semiconductor layer 25 is positioned inside the end portion of the seventh semiconductor layer 24, and therefore, a separation barrier in the separation region 13 can be stably formed and a desired value of separation characteristics between the pixel circuit region 150 and the first region 32 including the frame-shaped region 32a can be obtained.

Note that the example where the plural lines of dummy APDs 32b are arranged in the Y-direction has been described in the present variation, but the plural lines of dummy APDs 32b may be arranged in the X-direction outside the pixel array portion 120 depending on arrangement of the APDs 31 and the pixel circuit regions 150 in the pixel array portion 120.

Third Embodiment

Figure 22:
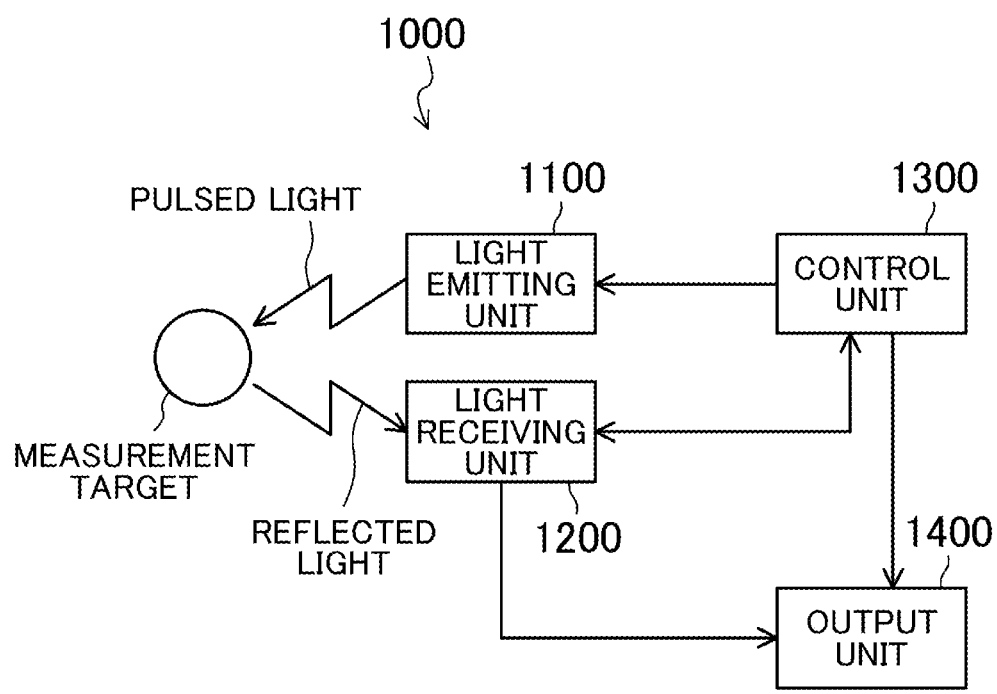
FIG. 22 shows a schematic configuration diagram of a distance measurement system according to a third embodiment.

FIG. 22 shows a schematic configuration diagram of a distance measurement system according to the present embodiment, and the distance measurement system 1000 includes a light emitting unit 1100, a light receiving unit 1200, a control unit 1300, and an output unit 1400.

The light emitting unit 1100 includes a light emitting device such as a light emitting diode, and generates pulsed light according to a control signal from the control unit 1300 to irradiate a measurement target with the pulsed light.

The light receiving unit 1200 is a solid-state image sensor 100 disclosed in the specification of the present application, and receives the pulsed light reflected on the measurement target.

The control unit 1300 includes, for example, a central processing unit (CPU), and controls the light emitting unit 1100 and the light receiving unit 1200 to operate in synchronization with each other. Moreover, the control unit 1300 measures, based on the control signal for the light emitting unit 1100 and an output signal from the light receiving unit 1200, a time until the pulsed light returns to the light receiving unit 1200 after having reflected on the measurement target, thereby calculating a distance to the measurement target.

The output unit 1400 outputs the distance to the measurement target in the form of numerical data or an image, the distance being calculated by the control unit 1300. The output unit 1400 normally includes a display such as a liquid crystal display or an organic EL display.

The distance measurement system 1000 described in the present embodiment is a so-called time-of-flite (TOF) distance measurement system.

According to the present embodiment, the solid-state image sensor 100 including the APDs 31 is used so that detection can be performed even in the case of faint reflected light. Moreover, the timing of turning on a transfer transistor 202 can be set as necessary, and therefore, erroneous distance sensing due to background light can be prevented and the distance to the measurement target can be obtained with a high accuracy.

Other Embodiments

The components described in each embodiment and each variation may be combined as necessary to form new embodiments. For example, the tenth semiconductor layer 27 described in the fourth variation may be provided in the first region 32 described in any of the first and second embodiments and the first to third variations.

Figure 23:
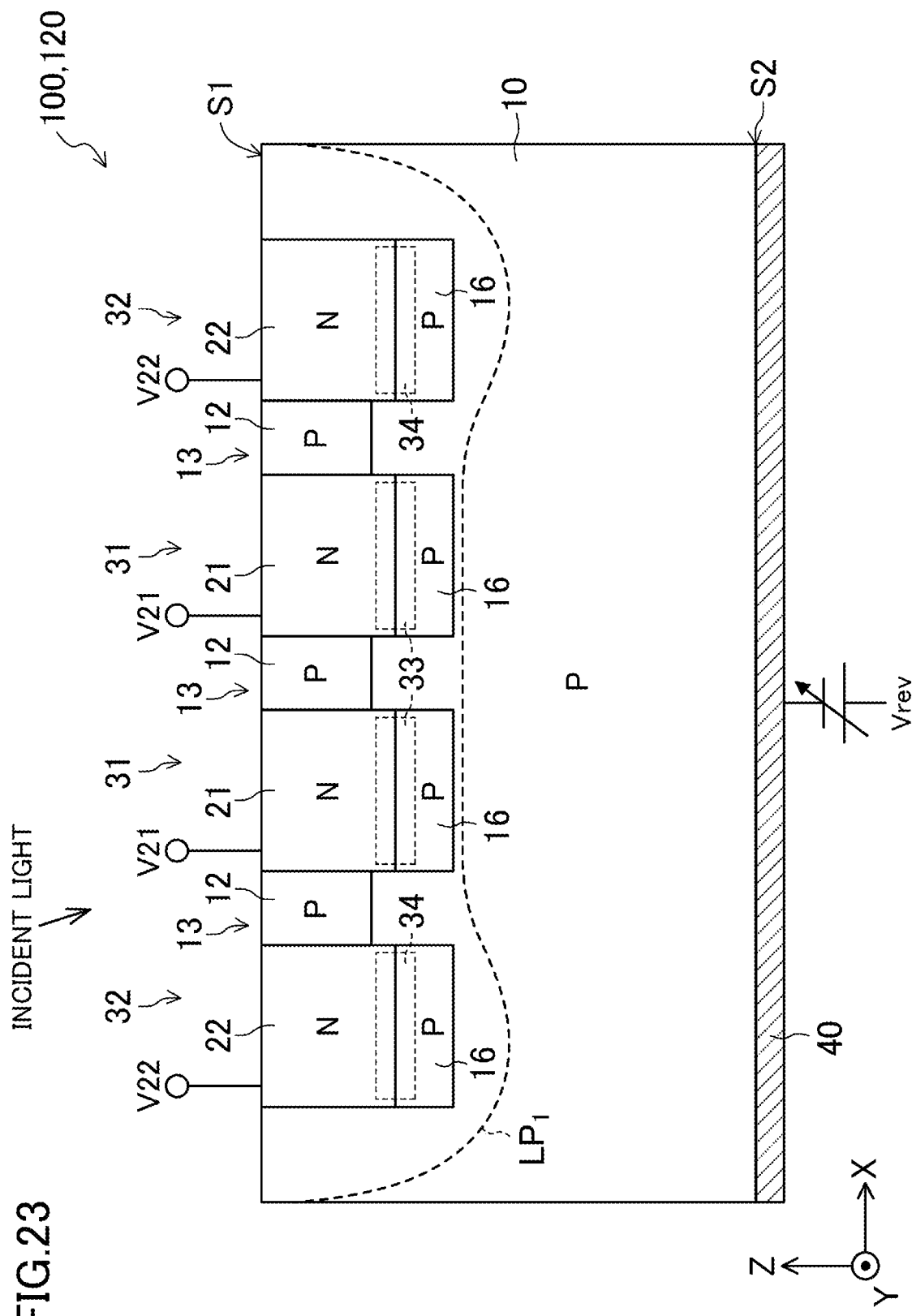
FIG. 23 shows a schematic sectional view of another pixel array portion.

The structure of the solid-state image sensor 100, particularly the structure of the pixel array portion 120, is not limited to the above-described structure, and other structures may be employed as necessary. For example, as shown in FIG. 23, a p-type twelfth semiconductor layer 16 may be provided below the fourth semiconductor layer 21 of the APD 31 or the fifth semiconductor layer 22 of the first region 32 in contact with the fourth semiconductor layer 21 or the fifth semiconductor layer 22. The twelfth semiconductor layer 16 is formed in such a manner that a p-type impurity is injected into the substrate 110 by, e.g., ion implantation by means of a not-shown resist mask pattern.

The pixel array portion 120 has the structure shown in FIG. 23 so that the breakdown voltage of the APD 31 can be decreased. Note that the impurity concentration of the twelfth semiconductor layer 16 positioned below the fifth semiconductor layer 22 of the first region 32 may be set lower than the impurity concentration of the twelfth semiconductor layer 16 positioned below the fourth semiconductor layer 21 of the APD 31. With this configuration, the absolute value of the breakdown voltage of the first region 32 can be increased. FIG. 23 shows that a depletion layer end is positioned below the twelfth semiconductor layer 16, but a so-called reach-through APD configured such that a depletion layer end extends to the second principal surface S2 side may be employed.

Note that a hole generated by photoelectric conversion may be avalanche-multiplied into a signal charge. In this case, the conductive type of each semiconductor layer described in each embodiment and each variation, such as the first to twelfth semiconductor layers 10 to 12, 14 to 16, 21 to 25, 26, 27, is changed as necessary, needless to say.

In the specification of the present application, the case where light enters the substrate 110 through the first principal surface S1 thereof has been described as an example. However, light may enter the substrate 110 through the second principal surface S2 thereof. In this case, a transparent electrode of, e.g., indium tin oxide (ITO) is used as the back electrode 40. Moreover, the polarity of the voltage to be applied to the back electrode 40 and the polarities of the first and second reverse biases V1, V2 are changed, needless to say.

Note that in the specification of the present application, the solid-state image sensor 100 has been described as an example. However, the present disclosure may be implemented as a photodetector (in other words, an optical sensor) configured not to capture an image other than the solid-state image sensor. In this case, the pixel array portion 120 may include one APD 31.

The photodetector of the present disclosure can relax electric field concentration at the end portion of the pixel array portion, and accordingly, can achieved stable operation. Thus, the photodetector is useful for applying the photodetector to the solid-state image sensor used for, e.g., the distance measurement system.

What is claimed is:

1. A photodetector comprising:
   a semiconductor substrate including a first principal surface and a second principal surface that is opposite to the first principal surface in a thickness direction of the semiconductor substrate; and
   at least two or more avalanche photodiodes (APDs) formed in the semiconductor substrate, wherein:
   a first region is arranged outside the APDs as viewed in plane,
   adjacent ones of the APDs and the first region are separated from each other through a separation region,
   each APD includes a first semiconductor layer of a second conductive type included in the semiconductor substrate and a fourth semiconductor layer of a first conductive type contacting the first semiconductor layer,
   the first region includes the first semiconductor layer and a fifth semiconductor layer of the first conductive type contacting the first semiconductor layer,
   a first voltage V21 is applied to the fourth semiconductor layer of each APD, and a second voltage V22 is applied to the fifth semiconductor layer of the first region,
   the first voltage V21 is higher than the second voltage V22,
   a third voltage Vrev is applied to the second principal surface,
   the first voltage V21, the second voltage V22, and the third voltage Vrev are controlled so that a difference between a first reverse bias V1 to be applied to each APD and a second reverse bias V2 to be applied to the first region is smaller than a difference in potential between the separation region and the first region, and
   following relationships are satisfied:

$$|V1|=V21+|Vrev| \quad (1), \text{ and}$$

$$|V2|=V22+|Vrev| \quad (2).$$

2. The photodetector of claim 1, wherein
   the separation region is depleted at least part of a first principal surface of the semiconductor substrate.

3. The photodetector of claim 2, wherein
   in the separation region, no contact connected to the separation region is arranged, and no trench extending inwardly from a surface of the separation region is formed.

4. The photodetector of claim 1, wherein
   the first voltage V21 and the second voltage V22 are controlled so that the difference between the first reverse bias V1 and the second reverse bias UV2 is greater than an excess bias voltage as a difference between an absolute value of a voltage to be applied upon operation of each APD and an absolute value of a breakdown voltage of each APD.

5. The photodetector of claim 1, wherein
   an absolute value of a breakdown voltage of the first region is greater than the absolute value of the breakdown voltage of each APD.

6. The photodetector of claim 5, wherein
   a PN junction boundary in the first region is positioned inside the semiconductor substrate with respect to a PN junction boundary in each APD.

7. The photodetector of claim 5, wherein
   a difference between the absolute value of the breakdown voltage of the first region and the absolute value of the breakdown voltage of each APD is greater than the excess bias voltage as the difference between the absolute value of the voltage to be applied upon operation of each APD and the absolute value of the breakdown voltage of each APD.

8. The photodetector of claim 1, further comprising:
   a pixel circuit region,
   wherein the pixel circuit region has a circuit well, and
   an absolute value of a breakdown voltage between the circuit well and the first semiconductor layer is greater than the absolute value of the breakdown voltage of each APD.

9. The photodetector of claim 8, wherein
   the breakdown voltage of the first region is equal to the breakdown voltage between the circuit well and the first semiconductor layer.

10. The photodetector of claim 8, wherein:
    the circuit well includes a seventh semiconductor layer of the first conductive type formed on the semiconductor substrate and an eighth semiconductor layer of the first conductive type contacting the seventh semiconductor layer,
    an impurity concentration of the fifth semiconductor layer is equal to an impurity concentration of the seventh semiconductor layer, and
    a depth of the fifth semiconductor layer and a depth of the seventh semiconductor layer are equal to each other with reference to the first principal surface of the semiconductor substrate.

11. The photodetector of claim 1, wherein
    the first region is, as viewed in plane, formed in a frame shape surrounding one or more APDs.

12. The photodetector of claim 1, wherein
    the first region further has a tenth semiconductor layer of the first conductive type extending to project to a side opposite to an adjacent one of the APDs in a vicinity of a junction surface between the first region and the first semiconductor layer.

13. The photodetector of claim 1, further comprising:
    an electric field relaxing region outside the first region,
    wherein an impurity concentration of the electric field relaxing region is lower than an impurity concentration of the first semiconductor layer, and
    no silicide is formed on a surface of the electric field relaxing region.

14. The photodetector of claim 13, wherein
    a large portion of the electric field relaxing region is covered with a shallow trench isolation (STI).

15. The photodetector of claim 1, wherein
    the APDs are operated in a Geiger multiplication mode, and
    each APD is at least temporarily connected only to a capacitor upon photodetection.

16. The photodetector of claim 15, wherein
    the first region is connected to a resistor in series.

* * * * *